US011272610B1

(12) United States Patent
Suzuki

(10) Patent No.: US 11,272,610 B1
(45) Date of Patent: Mar. 8, 2022

(54) PRINTED WIRING BOARD, MEMORY SYSTEM, AND METHOD FOR MANUFACTURING PRINTED WIRING BOARD

(71) Applicant: Kioxia Corporation, Tokyo (JP)

(72) Inventor: Daigo Suzuki, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/117,854

(22) Filed: Dec. 10, 2020

(30) Foreign Application Priority Data

Aug. 28, 2020 (JP) .............................. JP2020-144942

(51) Int. Cl.

| H05K 1/09 | (2006.01) |
| H05K 1/02 | (2006.01) |
| H01L 25/18 | (2006.01) |
| H05K 1/11 | (2006.01) |
| H05K 1/18 | (2006.01) |
| H05K 3/24 | (2006.01) |
| H05K 3/46 | (2006.01) |
| H05K 3/38 | (2006.01) |
| H05K 3/10 | (2006.01) |

(52) U.S. Cl.
CPC ........... *H05K 1/0242* (2013.01); *H01L 25/18* (2013.01); *H05K 1/09* (2013.01); *H05K 1/111* (2013.01); *H05K 1/181* (2013.01); *H05K 3/244* (2013.01); *H05K 3/108* (2013.01); *H05K 3/386* (2013.01); *H05K 3/4652* (2013.01); *H05K 2201/0347* (2013.01); *H05K 2201/10159* (2013.01); *H05K 2203/072* (2013.01)

(58) Field of Classification Search
CPC .................................................... H05K 1/0242
USPC ......................................................... 361/783
See application file for complete search history.

(56) References Cited

U.S. PATENT DOCUMENTS

| 7,867,353 B2 | 1/2011 | Kumar et al. | |
| 2011/0233741 A1* | 9/2011 | Ishii ................. | H01L 23/49861 |
| | | | 257/668 |
| 2017/0117252 A1* | 4/2017 | Baik ................... | H01L 23/3128 |
| 2017/0372814 A1* | 12/2017 | King ..................... | H01B 3/421 |
| 2018/0185658 A1* | 7/2018 | Blood .................... | H01L 41/29 |

(Continued)

FOREIGN PATENT DOCUMENTS

| JP | 2005-101398 A | 4/2005 |
| JP | 2016-12634 A | 1/2016 |
| TW | 201236521 A1 | 9/2012 |

(Continued)

*Primary Examiner* — Stanley Tso
(74) *Attorney, Agent, or Firm* — Oblon, McClelland, Maier & Neustadt, L.L.P.

(57) ABSTRACT

A printed wiring board includes a first insulator, a second insulator, a first conductor, and a second conductor. The first conductor is between the first insulator and the second insulator. The first conductor contains a first conductive material. The second conductor includes a first portion. The first portion is between the first insulator and the first conductor. The first portion is in contact with the first conductor and extends along the first conductor. The second conductor contains a second conductive material. The second conductive material is lower in electrical resistivity than the first conductive material. The second insulator is closer to an outside of the printed wiring board than the first insulator is in a thickness direction of the printed wiring board.

11 Claims, 15 Drawing Sheets

(56) References Cited

U.S. PATENT DOCUMENTS

2019/0029122 A1* 1/2019 Len .................... C23C 18/42

FOREIGN PATENT DOCUMENTS

| TW | 201244576 A1 | 11/2012 |
| TW | 201803425 A | 1/2018 |
| TW | 201817297 A | 5/2018 |

* cited by examiner

| Gen5 | 16GHz | | IN CASE OF Cu | IN CASE OF Ag |
|---|---|---|---|---|
| d | SKIN DEPTH | μm | 0.515722613 | 0.501649448 |
| ρ | ELECTRICAL RESISTIVITY | Ω·m | 1.68E-08 | 1.59E-08 |
| ω | ANGULAR FREQUENCY (2πf) | Hz | 1.00531E+11 | 1.00531E+11 |
| μ | MAGNETIC PERMEABILITY | H/m | 1.25663E-06 | 1.25697E-06 |

(b)

| Gen6 | 32GHz | | IN CASE OF Cu | IN CASE OF Ag |
|---|---|---|---|---|
| d | SKIN DEPTH | μm | 0.364670957 | 0.354719726 |
| ρ | ELECTRICAL RESISTIVITY | Ω·m | 1.68E-08 | 1.59E-08 |
| ω | ANGULAR FREQUENCY (2πf) | Hz | 2.01062E+11 | 2.01062E+11 |
| μ | MAGNETIC PERMEABILITY | H/m | 1.25663E-06 | 1.25697E-06 |

PRINTED WIRING BOARD, MEMORY SYSTEM, AND METHOD FOR MANUFACTURING PRINTED WIRING BOARD

CROSS-REFERENCE TO RELATED APPLICATION

This application is based upon and claims the benefit of priority from Japanese Patent Application No. 2020-144942, filed Aug. 28, 2020; the entire contents of which are incorporated herein by reference.

FIELD

Embodiments described herein relate generally to a printed circuit board, a memory system, and a method for manufacturing a printed wiring board.

BACKGROUND

A printed wiring board including a wiring pattern formed of a copper material is known. It is required that transmission characteristics of the printed wiring board be improved.

BRIEF DESCRIPTION OF THE DRAWINGS

FIG. 7 is a view showing an example of a skin depth of the printed wiring board according to the first embodiment.

DETAILED DESCRIPTION

Figure 1:
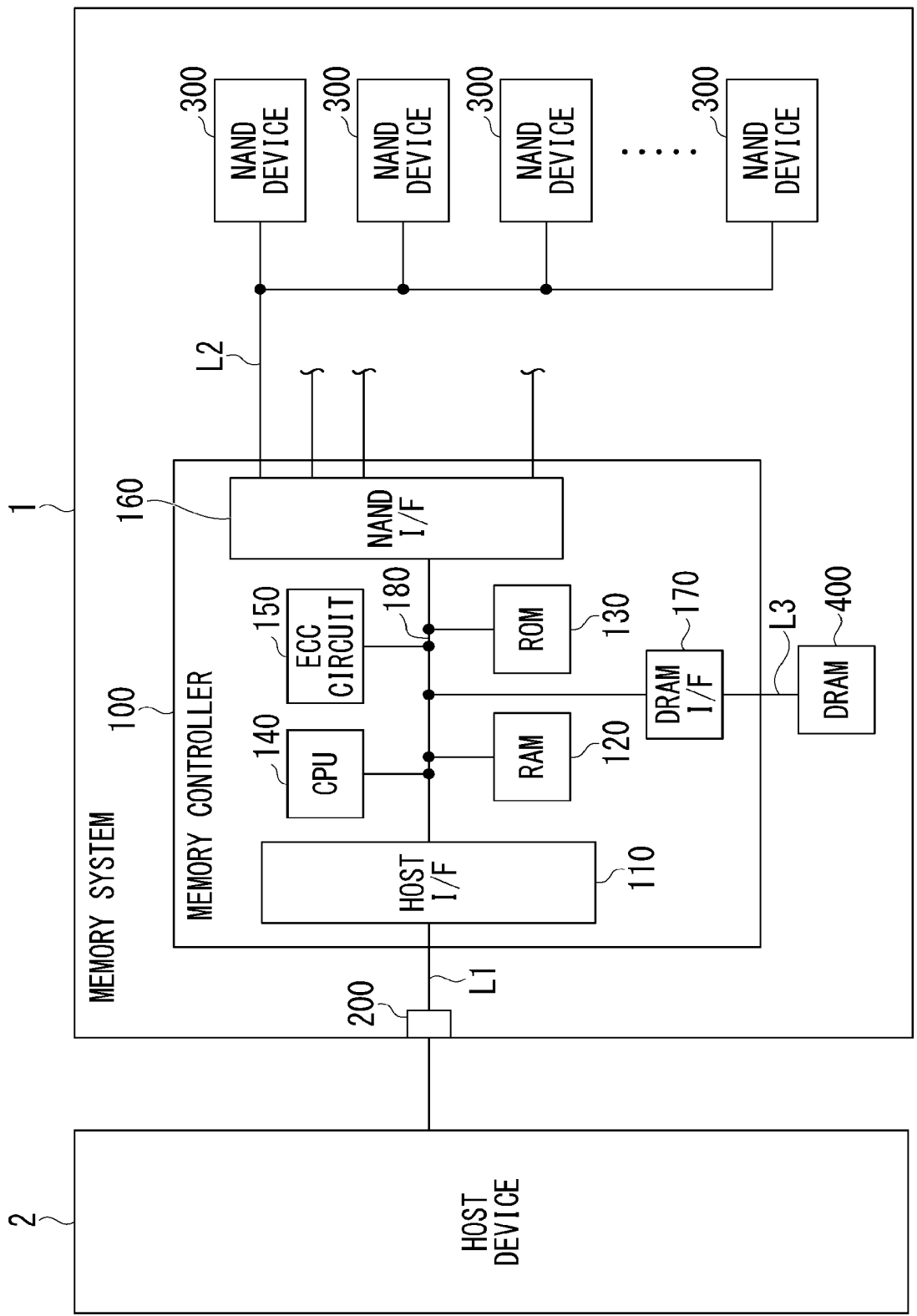
FIG. 1 is a block diagram showing a configuration of a memory system according to a first embodiment connected to a host device.

According to one embodiment, a printed wiring board includes a first insulator, a second insulator, a first conductor, and a second conductor. The first conductor is between the first insulator and the second insulator. The first conductor contains a first conductive material. The second conductor includes a first portion. The first portion is between the first insulator and the first conductor. The first portion is in contact with the first conductor and extends along the first conductor. The second conductor contains a second conductive material. The second conductive material is lower in electrical resistivity than the first conductive material. The second insulator is closer to an outside of the printed wiring board than the first insulator is in a thickness direction of the printed wiring board.

Hereinafter, a printed wiring board, a memory system, and a method for manufacturing a printed wiring board according to embodiments will be described with reference to the drawings. In the following description, constituents having the same or similar functions are designated by the same reference numerals. Then, duplicated description thereof may be omitted. In the following description, "parallel" may include a case of "substantially parallel," and "orthogonal" also may include a case of "substantially orthogonal". "Overlapping" means that virtual projection images of two target objects overlap each other and may include a case in which the two target objects are not into direct contact with each other. "Connection" is not limited to mechanical connection, and also may include electrical connection. On the other hand, "being in contact" means that two members are adjoining each other without anything intervening therebetween.

First, an X direction, a Y direction, and a Z direction are defined. The X direction and the Y direction are directions along a first surface 10a (refer to FIG. 3) of a first insulating base 10 of a printed wiring board 5 which will be described later. The X direction is a direction in which at least a part of a wiring 60 described later extends. The Y direction is a direction which intersects (for example, is orthogonal to) the X direction. The Z direction is a direction which intersects (for example, is orthogonal to) the X direction and the Y direction. The Z direction is a thickness direction of the printed wiring board 5. In the specification, expressions such as "upward" or "downward" are used for convenience of explanation and do not specify a direction of gravity.

First Embodiment

<1. Overall Configuration of Memory System>

FIG. 1 is a block diagram showing a configuration of a memory system 1 according to a first embodiment connected to a host device 2. The memory system 1 is a storage device such as a solid state drive (SSD). The memory system 1 is to be connected to the host device 2 and serves as an external storage device for the host device 2. The host device 2 is a device which controls the memory system 1 in an information processing device such as a server device, a personal computer, or a mobile terminal. The host device 2 can issue access requests (a write request of data, a read request of data, or the like) to the memory system 1.

The memory system 1 includes, for example, a memory controller 100, an external connection terminal 200, one or more (for example, a plurality of) NAND devices 300, and a dynamic random access memory (DRAM) 400. Note that the memory system 1 may not include the DRAM 400.

The memory controller 100 performs writing, reading, erasing, or the like of data to the NAND device 300 based on the access request issued by the host device 2. The memory controller 100 is an example of a "controller". The memory controller 100 will be described in detail later. The external connection terminal 200 is terminal pins, terminal pads, or the like, and is capable of being electrically connected to the host device 2.

The NAND device 300 is a NAND type flash memory. The NAND device 300 includes a memory cell array including a plurality of memory cells and stores data in a non-volatile manner. The NAND device 300 is an example of a "semiconductor memory device". Note that the semiconductor memory device is not limited to the above example and may be a resistance change type, a magnetic change type, or another type of semiconductor memory device. The DRAM 400 temporarily stores, for example, write data which is received from the host device 2 and to be written to the NAND device 300, and/or read data which is read from the NAND device 300 and to be transmitted to the host device 2.

<2. Configuration of Memory Controller>

Next, the memory controller 100 will be described in detail. The memory controller 100 includes, for example, a host interface circuit (a host I/F) 110, a random access memory (RAM) 120, a read only memory (ROM) 130, a central processing unit (CPU) 140, an error correcting code (ECC) circuit 150, a NAND interface circuit (a NAND I/F) 160, and a DRAM interface circuit (a DRAM I/F) 170. Such constitutions are connected to each other by a bus 180. For example, the memory controller 100 is constituted of a system-on-a-chip (SoC) in which the constitutions are integrated into one chip. Note that some of these constitutions may be provided outside the memory controller 100. One or more of the RAM 120, the ROM 130, the CPU 140, and the ECC circuit 150 may be provided inside the host I/F 110 or the NAND I/F 160.

The host I/F 110 performs control of data transmission between the host device 2 and the memory controller 100 under control of the CPU 140. The host I/F 110 transmits and receives electrical signals between the memory controller 100 and the host device 2 through a transmission line L1 between the memory controller 100 and the external connection terminal 200. The host I/F 110 is an example of a high-speed interface for transmitting and receiving high-speed signals.

The RAM 120 is, for example, a synchronous dynamic random access memory (SDRAM) or a static random access memory (SRAM) but is not limited thereto. The RAM 120 provides a work area for the CPU 140. Firmware (program) stored in the ROM 130 is loaded into the RAM 120 when the memory system 1 is booted up. The RAM 120 may serve as a buffer for data transmission between the host device 2 and the NAND devices 300.

The CPU 140 is an example of a hardware processor. The CPU 140 controls operations of the memory controller 100, for example, by executing the firmware loaded in the RAM 120. For example, the CPU 140 controls operations related to writing, reading, and erasing data with respect to the NAND devices 300.

The ECC circuit 150 encodes data to be written to the NAND device 300 for error correction. The ECC circuit 150 performs the error correction on read data based on an error correction code added during a writing operation.

The NAND I/F 160 performs the control of the data transmission between the memory controller 100 and the NAND devices 300 under the control of the CPU 140. The NAND I/F 160 transmits and receives electrical signals between the memory controller 100 and the NAND devices 300 through transmission lines L2 between the memory controller 100 and the NAND devices 300. The NAND I/F 160 is another example of the high-speed interface for transmitting and receiving high-speed signals.

The DRAM I/F 170 performs the control of the data transmission between the memory controller 100 and the DRAM 400 under the control of the CPU 140. The DRAM I/F 170 transmits and receives electrical signals between the memory controller 100 and the DRAM 400 through a transmission line L3 between the memory controller 100 and the DRAM 400. The DRAM I/F 170 is still another example of the high-speed interface for transmitting and receiving high-speed signals.

<3. Configuration of Printed Wiring Board>

Figure 2:
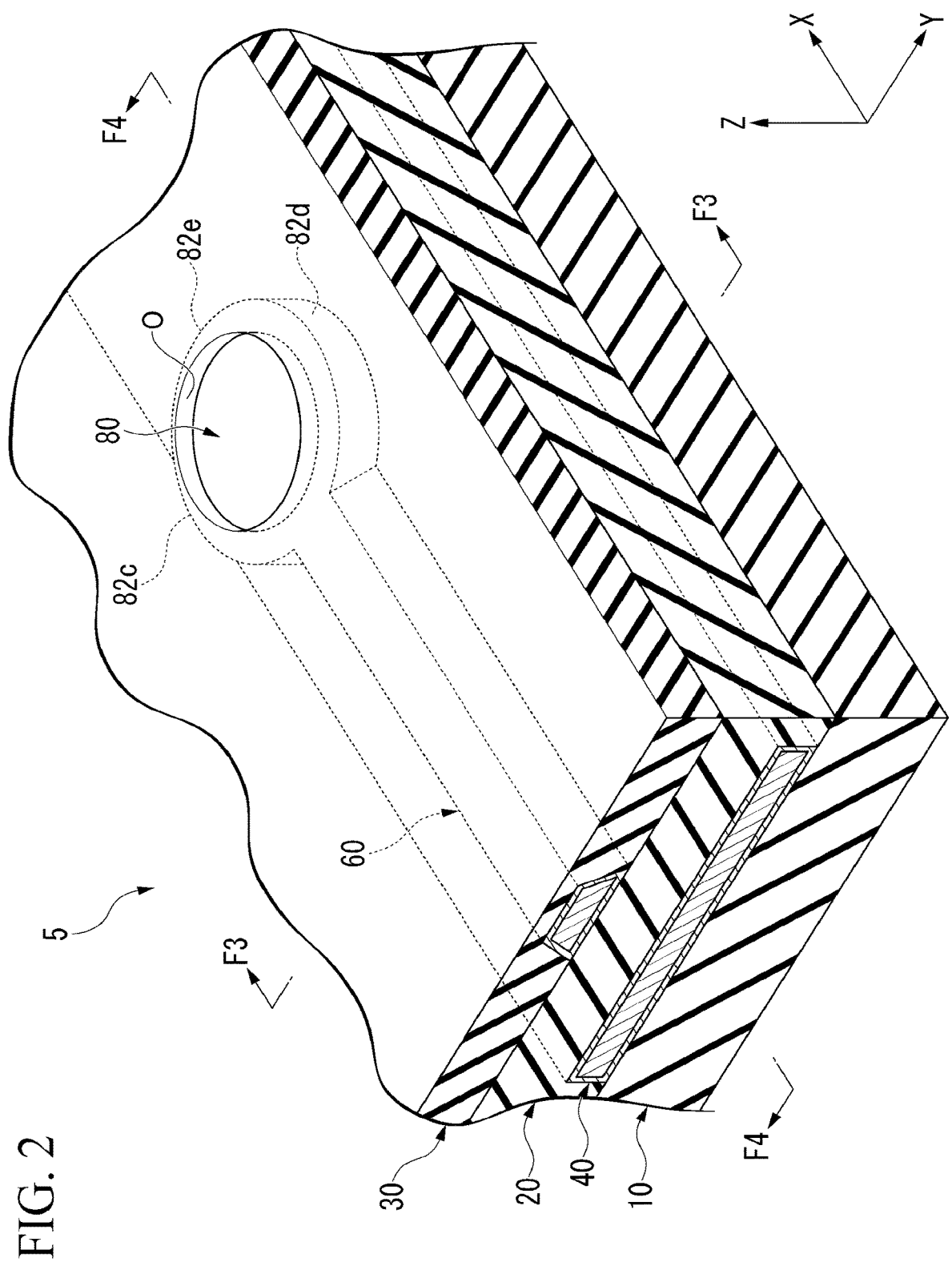
FIG. 2 is a perspective cross-sectional view showing a printed wiring board according to the first embodiment.

FIG. 2 is a perspective cross-sectional view showing the printed wiring board 5 according to the first embodiment. The printed wiring board 5 is included in the above-described memory system 1. The memory controller 100, the external connection terminal 200, the NAND devices 300, and the DRAM 400 are provided on the printed wiring board 5. The printed wiring board 5 is, for example, a multilayer board, and only some of the layers are shown in FIG. 2. This note also applies to the following drawings. The printed wiring board 5 may be a rigid board, a flexible board, or a rigid-flexible board in which the rigid board and the flexible board are integrally connected. The printed wiring board 5 is not limited to a multilayer board, and also may be a single-sided board or a double-sided board.

As shown in FIG. 2, the printed wiring board 5 includes a first insulating base 10, a second insulating base 20, a solder resist layer 30, a ground layer 40, an organic coating 50 (refer to FIG. 3), a wiring 60, an organic coating 70 (refer to FIG. 3), and a pad 80. The wiring 60, the ground layer 40, or a combination of the wiring 60 and the ground layer 40 constitutes at least a part of any one of the transmission line L1, the transmission line L2, or the transmission line L3 described above.

Figure 3:
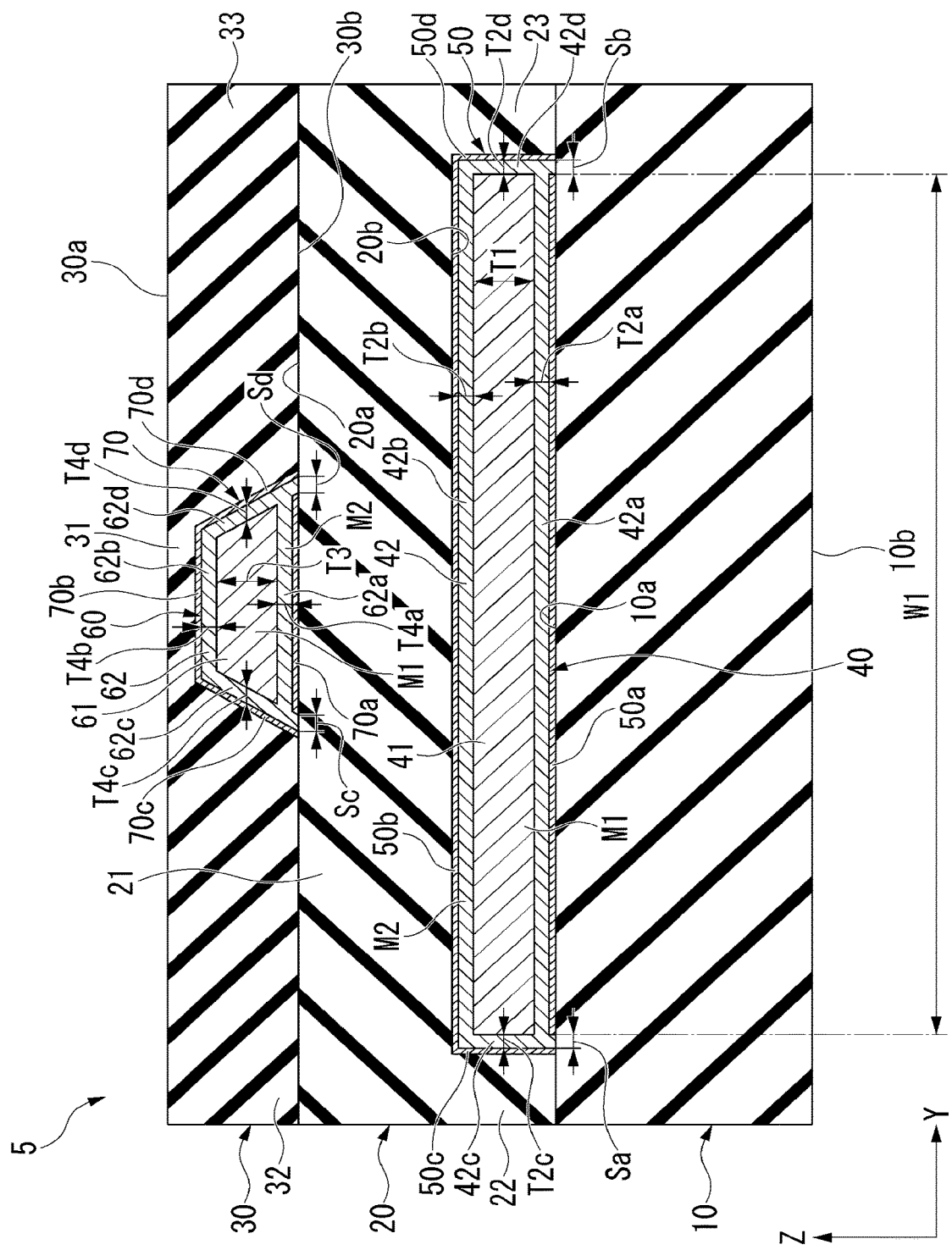
FIG. 3 is a cross-sectional view taken along line F3-F3 of the printed wiring board shown in FIG. 2.

FIG. 3 is a cross-sectional view taken along line F3-F3 of the printed wiring board 5 shown in FIG. 2.

The first insulating base 10 is formed in a layer shape extending in the X direction and the Y direction. The first insulating base 10 is formed of a general insulating material (e.g., a glass cloth base epoxy resin, a glass composite base epoxy resin, a paper base phenol resin, or polyimide) for a printed wiring board and has an insulating property. The first insulating base 10 includes a first surface 10a which faces the ground layer 40 and the second insulating base 20 which will be described later, and a second surface 10b which is located on a side opposite to the first surface 10a.

The second insulating base 20 is formed in a layer shape in the X direction and the Y direction. Like the first insulating base 10, the second insulating base 20 is formed of an insulating material for a general printed wiring board and has an insulating property. The second insulating base 20 overlaps the first insulating base 10 in the Z direction. The second insulating base 20 is located closer to an outside or the printed wiring board 5 in the Z direction than the first insulating base 10 is. The second insulating base 20 includes a first surface 20a which faces the wiring 60 and the solder resist layer 30 which will be described later, and a second surface 20b which is located on a side opposite to the first surface 20a and faces the ground layer 40 and the first insulating base 10. From a point of view, the first insulating base 10 is an example of a "first insulator", and the second insulating base 20 is an example of a "second insulator".

The second insulating base 20 includes a first portion 21 which overlaps the ground layer 40 in the Z direction, a second portion 22 which is adjacent to the ground layer 40 in the Y direction, and a third portion 23 which is adjacent to the ground layer 40 from a side opposite to the second portion 22. The second portion 22 and the third portion 23 are in contact with the first insulating base 10.

The solder resist layer 30 is exposed to the outside of the printed wiring board 5 and forms a part of a surface of the printed wiring board 5. The solder resist layer 30 is formed in a layer shape extending in the X direction and the Y direction. The solder resist layer 30 is a protective film which covers a circuit pattern including the wiring 60 which will be described later. The solder resist layer 30 is formed of, for example, an insulating material in which an epoxy resin and an inorganic powder are mixed, and has an insulating property. The solder resist layer 30 overlaps the second insulating base 20 in the Z direction. The solder resist layer 30 is located closer to the outside of the printed wiring board 5 in the Z direction than the second insulating base 20 is. The solder resist layer 30 includes a first surface 30a which is exposed to the outside of the printed wiring board 5 and a second surface 30b which is located on a side opposite to the first surface 30a and faces the wiring 60 and the second insulating base 20. From another point of view, the second insulating base 20 is an example of the "first insulator," and the solder resist layer 30 is an example of the "second insulator".

The solder resist layer 30 includes a first portion 31 which overlaps the wiring 60 in the Z direction, a second portion 32 which is adjacent to the wiring 60 in the Y direction, and a third portion 33 which is adjacent to the wiring 60 from a side opposite to the second portion 32. The second portion 32 and the third portion 33 are in contact with the second insulating base 20.

The ground layer (a ground pattern) 40 is a conductor pattern provided between the first insulating base 10 and the second insulating base 20. The ground layer 40 serves as a voltage reference for the printed wiring board 5 and forms a return path through which a return current of a current (e.g., an electric signal), which passes through the wiring 60 described later, flows. The ground layer 40 extends in the X direction and the Y direction. In the embodiment, the ground layer 40 is a planar pattern which extends in the X direction and the Y direction. A width of the ground layer 40 in the Y direction is larger than a width of the wiring 60 in the Y direction. The ground layer 40 overlaps the wiring 60 in the Z direction.

In the embodiment, the ground layer 40 includes a main body 41 and a surface layer 42. The main body 41 is located between the first insulating base 10 and the second insulating base 20. The main body 41 extends in the X direction along the first surface 10a of the first insulating base 10. In the embodiment, the main body 41 is formed in a layer shape extending in the X direction and the Y direction. A width W1 of the main body 41 in the Y direction is larger than a thickness T1 of the main body 41 in the Z direction. The thickness T1 of the main body 41 in the Z direction is, for example, 10 to 50 µm. The main body 41 is formed of a first conductive material M1. The first conductive material M1 is, for example, a metal material. The first conductive material M1 is, for example, copper. The main body 41 is an example of a "first conductor".

The surface layer 42 is formed of a second conductive material M2 different from the first conductive material M1. The second conductive material M2 is a conductive material having a lower electrical resistivity than that of the first conductive material M1. The second conductive material M2 is, for example, a metal material. The second conductive material M2 is, for example, silver. The surface layer 42 is an example of a "second conductor". In the embodiment, the surface layer 42 includes a first portion 42a, a second portion 42b, a third portion 42c, and a fourth portion 42d.

The first portion 42a is located between the first insulating base 10 and the main body 41. The first portion 42a is in contact with the main body 41 in the Z direction and extends in the X direction along the main body 41. In the embodiment, the first portion 42a is formed in a layer shape extending in the X direction and the Y direction.

The second portion 42b is located between the second insulating base 20 and the main body 41. That is, the second portion 42b overlaps the main body 41 from a side opposite to the first portion 42a in the Z direction. The second portion 42b is in contact with the main body 41 in the Z direction and extends in the X direction along the main body 41. In the embodiment, the second portion 42b is formed in a layer shape extending in the X direction and the Y direction.

The third portion 42c is located between the second portion 22 of the second insulating base 20 and the main body 41 in the Y direction. The third portion 42c is in contact with the main body 41 in the Y direction and extends in the X direction along the main body 41. In other words, the third portion 42c is in contact with the main body 41 from a direction different from directions in which the first portion 42a and the second portion 42b are in contact with the main body 41, respectively. The third portion 42c also extends in the Z direction and connects the first portion 42a and the second portion 42b. In the embodiment, the third portion 42c is formed in a layer shape extending in the X direction and the Z direction.

The fourth portion 42d is located between the third portion 23 of the second insulating base 20 and the main body 41 in the Y direction. That is, the fourth portion 42d overlaps the main body 41 from a side opposite to the third portion 42c in the Y direction. The fourth portion 42d is in contact with the main body 41 in the Y direction and extends in the X direction along the main body 41. In other words, the fourth portion 42d is in contact with the main body 41 from a direction different from directions in which first portion 42a and the second portion 42b are in contact with the main body 41, respectively. The fourth portion 42d also extends in the Z direction and connects the first portion 42a and the second portion 42b. In the embodiment, the fourth portion 42d is formed in a layer shape extending in the X direction and the Z direction.

In the embodiment, the first portion 42a, the second portion 42b, the third portion 42c, and the fourth portion 42d described above are connected to each other. Thus, the surface layer 42 is formed in an annular shape which surrounds the main body 41 in a cross section in the Y direction and the Z direction (that is, a cross section shown in FIG. 3). Here, the "annular shape" in the embodiment may be an incomplete annular shape which includes a divided part due to manufacturing thereof, for example. Further, the "annular shape" is not limited to a circular ring shape, and includes a rectangular ring shape. These definitions are the same below.

In the embodiment, each of a thickness T2a of the first portion 42a in the Z direction, a thickness T2b of the second portion 42b in the Z direction, a thickness T2c of the third portion 42c in the Y direction, and a thickness T2d of the fourth portion 42d in the Y direction is, for example, 0.5 µm. That is, each of the thickness T2a of the first portion 42a in the Z direction, the thickness T2b of the second portion 42b in the Z direction, the thickness T2c of the third portion 42c in the Y direction, and the thickness T2d of the fourth portion 42d in the Y direction is thinner than the thickness T1 of the main body 41 in the Z direction. In the embodiment, a sum of the thickness T2a of the first portion 42a in the Z direction and the thickness T2b of the second portion 42b in the Z direction is thinner than the thickness T1 of the main body 41 in the Z direction.

Figure 4:
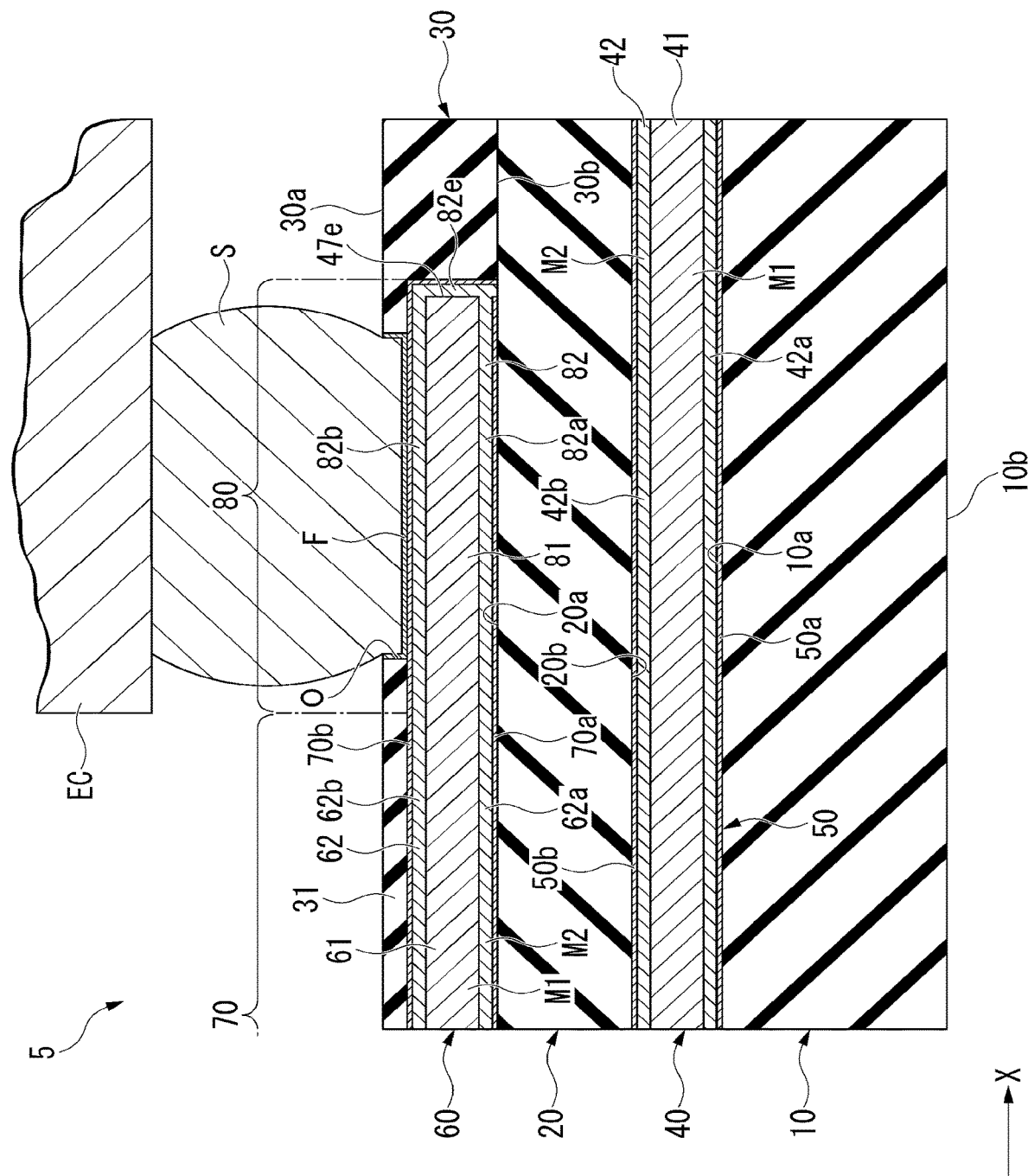
FIG. 4 is a cross-sectional view taken along line F4-F4 of the printed wiring board shown in FIG. 2.

FIG. 4 is a cross-sectional view taken along line F4-F4 of the printed wiring board 5 shown in FIG. 2.

As shown in FIG. 4, the surface layer 42 is provided over the entire length of the main body 41 or in a part of the entire length of the main body 41. For example, the surface layer 42 covers the main body 41 in an annular shape over the entire length of the main body 41 or in a part of the entire length of the main body 41.

Returning to FIG. 3, the organic coating 50 will be described. The organic coating 50 is formed in an annular shape which covers the surface layer 42 of the ground layer 40 from the outer peripheral side in a cross section in the Y direction and the Z direction (that is, a cross section shown in FIG. 3). The organic coating 50 includes a first portion 50a, a second portion 50b, a third portion 50c, and a fourth portion 50d.

The first portion 50a is provided between the first portion 42a of the surface layer 42 and the first insulating base 10 and covers the first portion 42a of the surface layer 42. The second portion 50b is provided between the second portion 42b of the surface layer 42 and the first portion 21 of the second insulating base 20 and covers the second portion 42b of the surface layer 42. The third portion 50c is provided between the third portion 42c of the surface layer 42 and the second portion 22 of the second insulating base 20 and covers the third portion 42c of the surface layer 42. The fourth portion 50d is provided between the fourth portion 42d of the surface layer 42 and the third portion 23 of the second insulating base 20 and covers the fourth portion 42d of the surface layer 42.

In the embodiment, there is a gap Sa between the first portion 50a and the third portion 50c in the Y direction. The first portion 50a and the third portion 50c are separated by the gap Sa. The gap Sa is located between the third portion 42c of the surface layer 42 and the first insulating base 10 in the Z direction. A width of the gap Sa in the Y direction is substantially the same as, for example, the thickness T2c of the third portion 42c of the surface layer 42 in the Y direction.

Similarly, there is a gap Sb between the first portion 50a and the fourth portion 50d in the Y direction. The first portion 50a and the fourth portion 50d are separated by the gap Sb. The gap Sb is located between the fourth portion 42d of the surface layer 42 and the first insulating base 10 in the Z direction. A width of the gap Sb in the Y direction is substantially the same as, for example, the thickness T2d of the fourth portion 42d of the surface layer 42 in the Y direction.

The organic coating 50 is a functional layer which curbs ion migration of the second conductive material M2 (for example, silver). The organic coating 50 is formed by applying, for example, a chelating agent, or a thiol agent. A thickness of the organic coating 50 is, for example, 1 μm. These are the same for the organic coating 70 which will be described later.

The wiring 60 is a wiring pattern provided in the printed wiring board 5. The wiring 60 is provided between the second insulating base 20 and the solder resist layer 30. At least a part of the wiring 60 extends in the X direction. In the embodiment, the wiring 60 is a signal line through which an electrical signal flows. As described above, the wiring 60 forms, for example, a wiring between the memory controller 100 and the external connection terminal 200, between the memory controller 100 and the NAND device 300, or between the memory controller 100 and the DRAM 400.

In the embodiment, a high-speed signal of 15 GHz or more flows through the wiring 60. For example, a signal of 32 GT/s (16 GHz) or 64 GT/s (32 GHz) corresponding to a fifth or sixth generation of peripheral component interconnect-express (PCIe) (registered trademark) flows through the wiring 60. Note that the signal flowing through the wiring 60 is not limited to the above example.

In the embodiment, the wiring 60 includes a main body 61 and a surface layer 62. The surface layer 62 includes a first portion 62a, a second portion 62b, a third portion 62c, and a fourth portion 62d. A configuration of the wiring 60 is the same as the configuration of the ground layer 40. Therefore, for a detailed description of the wiring 60, in the above description of the ground layer 40, "the main body 41," "the surface layer 42," "the first portion 42a," "the second portion 42b," "the third portion 42c," "the fourth portion 42d," "the first insulating base 10," "the second insulating base 20," "the first portion 21," "the second portion 22," and "the third portion 23" are respectively replaced with "the main body 61," "the surface layer 62," "the first portion 62a," "the second portion 62b," "the third portion 62c," "the fourth portion 62d," "the second insulating base 20," "the solder resist layer 30," "the first portion 31," "the second portion 32," and "the third portion 33". The main body 61 is another example of the "first conductor". The surface layer 62 is another example of the "second conductor". Table 1 shows the correspondence between constituents used in the explanation of the ground layer 40 (constituents before replacement) and constituents used in the explanation of the wiring 60 (constituents after replacement).

| Constituent before replacement | Constituent after replacement |
| --- | --- |
| Main body 41 | Main body 61 |
| Surface layer 42 | Surface layer 62 |
| First portion 42a | First portion 62a |
| Second portion 42b | Second portion 62b |
| Third portion 42c | Third portion 62c |
| Fourth portion 42d | Fourth portion 62d |
| First insulating base 10 | Second insulating base 20 |
| Second insulating base 20 | Solder resist layer 30 |
| First portion 21 | First portion 31 |
| Second portion 22 | Second portion 32 |
| Third portion 23 | Third portion 33 |

In the embodiment, a thickness T3 of the main body 61 in the Z direction is, for example, 10 to 50 μm. Each of a thickness T4a of the first portion 62a of the surface layer 62 in the Z direction, a thickness T4b of the second portion 62b of the surface layer 62 in the Z direction, a thickness T4c of the third portion 62c of the surface layer 62 in the Y direction, and a thickness T4d of the fourth portion 62d of the surface layer 62 in the Y direction is, for example, 0.5 That is, each of the thickness T4a of the first portion 62a in the Z direction, the thickness T4b of the second portion 62b in the Z direction, the thickness T4c of the third portion 62c in the Y direction, and the thickness T4d of the fourth portion 62d in the Y direction is thinner than the thickness T3 of the main body 61 in the Z direction. In the embodiment, a sum of the thickness T4a of the first portion 62a in the Z direction and the thickness T4b of the second portion

62*b* in the Z direction is thinner than the thickness T3 of the main body 61 in the Z direction.

The organic coating 70 is formed in an annular shape which covers the surface layer 62 of the wiring 60 from the outer peripheral side in a cross section in the Y direction and the Z direction (that is, the cross section shown in FIG. 3). The organic coating 70 includes a first portion 70*a*, a second portion 70*b*, a third portion 70*c*, and a fourth portion 70*d*.

The first portion 70*a* is provided between the first portion 62*a* of the surface layer 62 and the second insulating base 20, and covers the first portion 62*a* of the surface layer 62. The second portion 70*b* is provided between the second portion 62*b* of the surface layer 62 and the first portion 31 of the solder resist layer 30, and covers the second portion 62*b* of the surface layer 62. The third portion 70*c* is provided between the third portion 62*c* of the surface layer 62 and the second portion 32 of the solder resist layer 30, and covers the third portion 62*c* of the surface layer 62. The fourth portion 70*d* is provided between the fourth portion 62*d* of the surface layer 62 and the third portion 33 of the solder resist layer 30, and covers the fourth portion 62*d* of the surface layer 62.

In the embodiment, there is a gap Sc between the first portion 70*a* and the third portion 70*c* in the Y direction. The first portion 70*a* and the third portion 70*c* are separated by the gap Sc. The gap Sc is located between the third portion 62*c* of the surface layer 62 and the second insulating base 20 in the Z direction. A width of the gap Sc in the Y direction is substantially the same as, for example, the thickness of the third portion 62*c* of the surface layer 62 in the Y direction.

Similarly, there is a gap Sd between the first portion 70*a* and the fourth portion 70*d* in the Y direction. The first portion 70*a* and the fourth portion 70*d* are separated by the gap Sd. The gap Sd is located between the fourth portion 62*d* of the surface layer 62 and the second insulating base 20 in the Z direction. A width of the gap Sd in the Y direction is substantially the same as, for example, the thickness of the fourth portion 62*d* of the surface layer 62 in the Y direction.

Next, the pad 80 will be described. The pad 80 is a portion wider in the Y direction than the wiring 60 (refer to FIG. 2). As shown in FIG. 4, the pad 80 is provided on the first surface 20*a* of the second insulating base 20. A peripheral edge portion of the pad 80 is covered with the solder resist layer 30. A part of the second portion 70*b* of the organic coating 70 provided on the pad 80 is exposed to the outside of the printed wiring board 5 through an opening O provided in the solder resist layer 30. In the embodiment, both the main body 61 and the surface layer 62 of the wiring 60 are connected to the pad 80.

The pad 80 includes the same configuration as the wiring 60, for example. That is, the pad 80 includes a main body 81 and a surface layer 82. The main body 81 is formed integrally with the main body 61 of the wiring 60, and is continuous with the main body 61 of the wiring 60. The main body 81 overlaps a connection terminal S of an electronic component EC, which will be described later, in the Z direction. In the embodiment, the main body 81 has a circular shape when seen in the Z direction. Note that the main body 81 may have a rectangular shape or other shapes.

The surface layer 82 of the pad 80 is provided integrally with the surface layer 62 of the wiring 60 and is continuous with the surface layer 62 of the wiring 60. The surface layer 82 includes a first portion 82*a*, a second portion 82*b*, a third portion 82*c* (refer to FIG. 2), a fourth portion 82*d* (refer to FIG. 2), and a fifth portion 82*e*.

The first portion 82*a* is located between the second insulating base 20 and the main body 81. The second portion 82*b* overlaps the main body 81 from a side opposite to the first portion 82*a* in the Z direction. At least a part of the second portion 82*b* faces the opening O in the Z direction via the second portion 70*b* of the organic coating 70. At least a part of the second portion 82*b* is located between the connection terminal S of the electronic component EC and the main body 81 when the electronic component EC is mounted. The connection terminal S of the electronic component EC is connected to at least a part of the second portion 82*b*.

The third portion 82*c* is adjacent to the main body 81 in the Y direction and is provided along a side surface of the main body 81 (refer to FIG. 2). In the embodiment, the third portion 82*c* has an arc shape when seen in the Z direction along a peripheral surface of the main body 81. The fourth portion 82*d* is adjacent to the main body 81 in the Y direction from a side opposite to the third portion 82*c*, and is provided along the side surface of the main body 81 (refer to FIG. 2). In the embodiment, the fourth portion 82*d* has an arc shape when seen in the Z direction along the peripheral surface of the main body 81. The fifth portion 82*e* is adjacent to the main body 81 in the X direction from a side opposite to the wiring 60, and is provided along the side surface of the main body 81 (refer to FIG. 2). The fifth portion 82*e* is a region of the surface layer 82 which overlaps the wiring 60 when seen in the X direction. The fifth portion 82*e* is provided between the third portion 82*c* and the fourth portion 82*d*. In the embodiment, the fifth portion 82*e* has an arc shape when seen in the Z direction along the peripheral surface of the main body 81.

As shown in FIG. 4, a part of the first portion 70*a* of the organic coating 70 is provided between the first portion 82*a* of the surface layer 82 and the second insulating base 20, and covers the first portion 82*a* of the surface layer 82. A part of the second portion 70*b* of the organic coating 70 is provided between the second portion 82*b* of the surface layer 82 and the first portion 31 of the solder resist layer 30, and between the second portion 82*b* of the surface layer 82 and the opening O, and covers the second portion 82*b* of the surface layer 82. A part of the organic coating 70 is provided between the fifth portion 82*e* of the surface layer 82 and the solder resist layer 30, and covers the fifth portion 82*e* of the surface layer 82. Although not shown in detail, a part of the third portion 70*c* of the organic coating 70 is provided between the third portion 82*c* of the surface layer 82 and the second portion 32 of the solder resist layer 30, and covers the third portion 82*c* of the surface layer 82. A part of the fourth portion 70*d* of the organic coating 70 is provided between the fourth portion 82*d* of the surface layer 82 and the third portion 33 of the solder resist layer 30, and covers the fourth portion 82*d* of the surface layer 82.

The electronic component EC is, for example, an electronic component having a ball grid array (BGA) package. In the embodiment, the electronic component EC is any one of the above-described memory controller 100, an interface component including the external connection terminal 200, the NAND device 300, or the DRAM 400. The connection terminal S is, for example, a solder connection portion (a solder ball) of the BGA package.

In the embodiment, a surface of the pad 80 is coated with flux F for enhancing connectivity between the connection terminal S of the electronic component EC and the pad 80. The connection terminal S of the electronic component EC is connected to the surface of the pad 80 via the flux F. Note that the flux F is not essential and may be omitted.

For other descriptions of the pad 80, in the above description of the ground layer 40, "the main body 41," "the surface layer 42," "the first portion 42a," "the second portion 42b," "the third portion 42c," "the fourth portion 42d," "the first insulating base 10," "the second insulating base 20," "the first portion 21," "the second portion 22," and "the third portion 23" are respectively replaced with "the main body 81," "the surface layer 82," "the first portion 82a," "the second portion 82b," "the third portion 82c," "the fourth portion 82d," "the second insulating base 20," "the solder resist layer 30," "the first portion 31," "the second portion 32," and "the third portion 33". Table 2 shows the correspondence between constituents used in the explanation of the ground layer 40 (constituents before replacement) and constituents used in the explanation of the pad 80 (constituents after replacement).

| Constituent before replacement | Constituent after replacement |
| --- | --- |
| Main body 41 | Main body 81 |
| Surface layer 42 | Surface layer 82 |
| First portion 42a | First portion 82a |
| Second portion 42b | Second portion 82b |
| Third portion 42c | Third portion 82c |
| Fourth portion 42d | Fourth portion 82d |
| First insulating base 10 | Second insulating base 20 |
| Second insulating base 20 | Solder resist layer 30 |
| First portion 21 | First portion 31 |
| Second portion 22 | Second portion 32 |
| Third portion 23 | Third portion 33 |

<4. Method for Manufacturing Printed Wiring Board>

Figure 5:
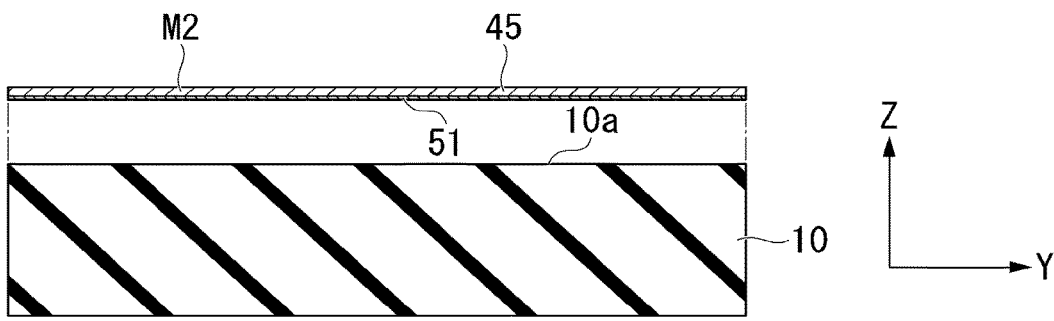
FIG. 5 is a cross-sectional view showing an example of a method for manufacturing the printed wiring board according to the first embodiment.
Figure 5:
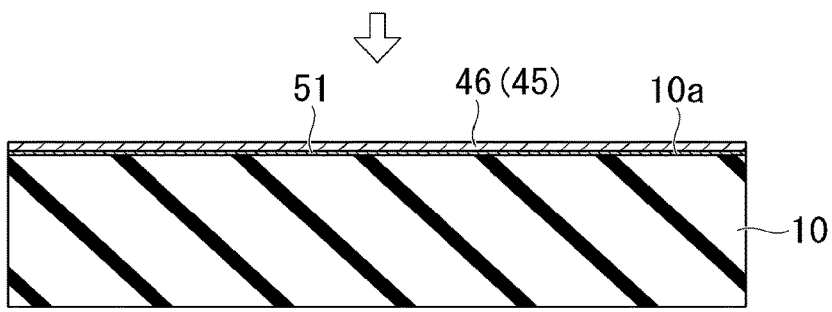
Figure 5:
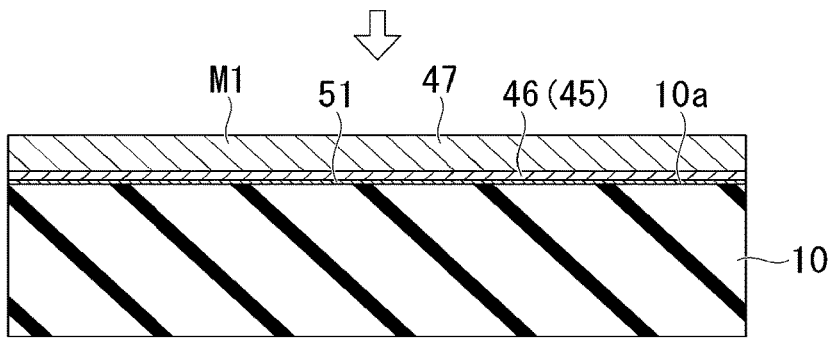
Figure 5:
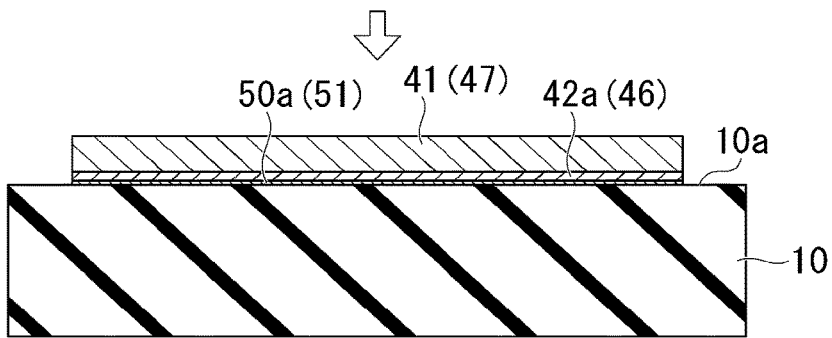
Figure 6:
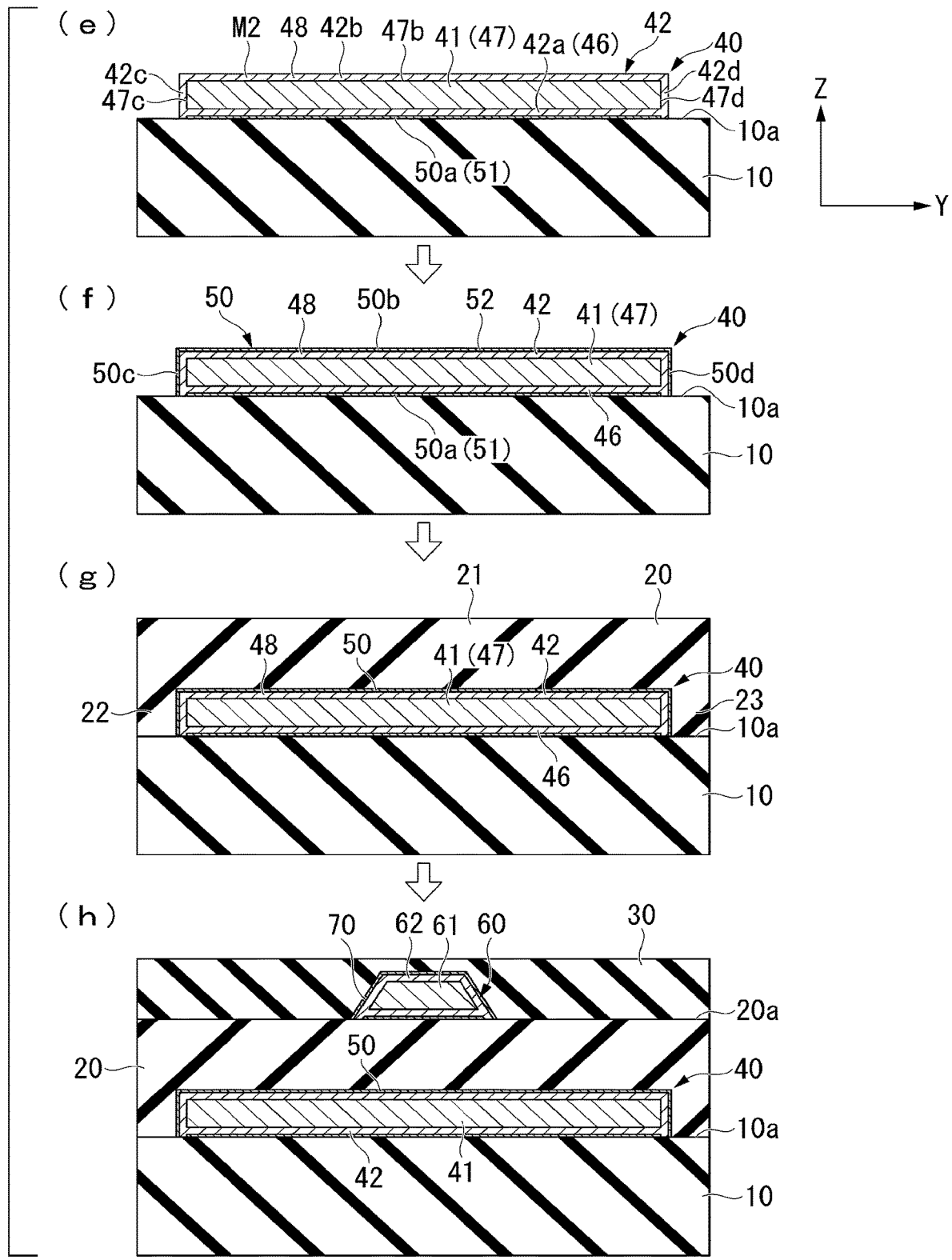
FIG. 6 is a cross-sectional view showing the example of the method for manufacturing the printed wiring board according to the first embodiment.

FIGS. 5 and 6 are views showing an example of a method for manufacturing the printed wiring board 5. First, as shown in (a) in FIG. 5, a metal foil 45 (for example, a silver foil) containing the second conductive material M2 is prepared. A material of the organic coating 50 is applied to one surface (a lower surface in FIG. 5) of the metal foil 45 to form a layered organic coating portion 51. The organic coating portion 51 is provided on, for example, the entire one surface of the metal foil 45.

Next, as shown in (b) in FIG. 5, the metal foil 45 with the organic coating portion 51 provided on the one surface is attached to the first surface 10a of the first insulating base 10. The metal foil 45 is attached to the first insulating base 10 by, for example, pressure welding, but other methods may be used. Thus, a second conductive layer 46 is formed on the first insulating base 10. The second conductive layer 46 is a planar layer which extends in the X direction and the Y direction. Here, "a component (e.g., a component B) is formed (or provided) on another component (e.g., a component A)" may include a case in which another layer is interposed between the component A and the component B, in addition to a case in which a surface of the component A and a surface of the component B are formed to be in contact with each other. This definition is the same below. For example, "the second conductive layer 46 is formed on the first insulating base 10" includes a case in which another layer is interposed between the first insulating base 10 and the second conductive layer 46, in addition to a case in which a surface of the first insulating base 10 and the second conductive layer 46 are formed to be in contact with each other. In the embodiment, the organic coating portion 51 is interposed between the first insulating base 10 and the second conductive layer 46.

Next, as shown in (c) in FIG. 5, a first conductive layer 47 containing the first conductive material M1 is formed on a surface of the second conductive layer 46. For example, the first conductive layer 47 is formed by performing a first plating treatment on the surface of the second conductive layer 46 using the first conductive material M1. The first plating treatment may be electrolytic plating or electroless plating, and in the case of the electrolytic plating, a relatively thick first conductive layer 47 can be preferably formed. The first conductive layer 47 is a planar layer which extends in the X direction and the Y direction.

Next, as shown in (d) in FIG. 5, pattern processing is performed on the first conductive layer 47, the second conductive layer 46, and the organic coating portion 51. That is, unnecessary portions of the first conductive layer 47, the second conductive layer 46, and the organic coating portion 51 are removed by etching the unnecessary portions of the first conductive layer 47, the second conductive layer 46, and the organic coating portion 51. Thus, the main body 41 of the ground layer 40 is formed of the first conductive layer 47, the first portion 42a of the surface layer 42 of the ground layer 40 is formed of the second conductive layer 46, and the first portion 50a of the organic coating 50 is formed of the organic coating portion 51. In the description of the embodiment, the first conductive layer 47 after the pattern processing is performed (that is, the main body 41 of the ground layer 40) may be referred to as a "first conductive layer" as well as the first conductive layer 47 before the pattern processing is performed.

Next, as shown in (e) in FIG. 6, a third conductive layer 48 containing the second conductive material M2 is formed on a surface of the main body 41 of the ground layer 40 (that is, the first conductive layer 47 subjected to the pattern processing). The third conductive layer 48 is formed by performing a second plating treatment using the second conductive material M2 on the surface of the main body 41 of the ground layer 40. The second plating treatment is, for example, electroless plating.

More specifically, the first conductive layer 47 subjected to the pattern processing has a first surface 47b which is directed to a side opposite to the second conductive layer 46 in the Z direction, a second surface 47c which is directed in a direction different from the first surface 47b, and a third surface 47d which is directed to a side opposite to the second surface 47c in the Y direction. The third conductive layer 48 is formed to be in contact with the first surface 47b, the second surface 47c, and the third surface 47d of the first conductive layer 47. That is, the third conductive layer 48 is formed such that it surrounds the main body 41 of the ground layer 40 in three directions. The third conductive layer 48 includes the second portion 42b, the third portion 42c, and the fourth portion 42d of the surface layer 42 of the ground layer 40 described above. Since the third conductive layer 48 is formed, the surface layer 42 which surrounds the main body 41 of the ground layer 40 in an annular shape is formed by the third conductive layer 48 and the second conductive layer 46 subjected to the pattern processing. Thus, the ground layer 40 is formed.

Next, as shown in (f) in FIG. 6, a material of the organic coating 50 is applied to an upper surface and left and right side surfaces of the ground layer 40. Thus, an organic coating portion 52 which surrounds the ground layer 40 in three directions is formed. The organic coating portion 52 includes the second portion 50b, the third portion 50c, and the fourth portion 50d of the organic coating 50 described above. Since the organic coating portion 52 is formed, the organic coating 50 which surrounds the surface layer 42 in an annular shape from the outer peripheral side is formed by the organic coating portion 52 and the above-described organic coating portion 51.

Next, as shown in (g) in FIG. 6, the second insulating base 20 is stacked on the first insulating base 10 and the ground layer 40. That is, the second insulating base 20 which covers the first conductive layer 47, the second conductive layer 46, and the third conductive layer 48 described above from a side opposite to the first insulating base 10 in the Z direction is provided.

Next, as shown in (h) in FIG. 6, the wiring 60 and the organic coating 70 are formed on the first surface 20a of the second insulating base 20. Details of a manufacturing method of the wiring 60 and the organic coating 70 are the same as the details of the manufacturing method of the ground layer 40 and the organic coating 50 (described with reference to (a) to (d) in FIG. 5 and (e) to (g) in FIG. 6), respectively. Further, in the embodiment, the pad 80 is formed in the same processing as that of the wiring 60.

Regarding the wiring 60 and the pad 80, the patterned first conductive layer 47 forms the main body 61 of the wiring 60 and the main body 81 of the pad 80. On the first conductive layer 47 subjected to the pattern processing, a fourth surface 47e (refer to FIG. 4) which is in contact with the fifth portion 82e of the surface layer 82 of the pad 80 is formed in a subsequent process in addition to the first surface 47b which is directed to a side opposite to the second conductive layer 46 in the 7 direction, the second surface 47c which is directed in a direction different from the first surface 47b, and the third surface 47d which is directed to a side opposite to the second surface 47c in the Y direction. Then, the third conductive layer 48 is formed to be in contact with the first surface 47b, the second surface 47c, the third surface 47d, and the fourth surface 47e of the first conductive layer 47.

Finally, the solder resist layer 30 is provided on the second insulating base 20 and the wiring 60, and the opening O is formed so that the pad 80 is exposed to the outside of the printed wiring board 5. Thus, the manufacturing or the printed wiring board 5 is completed.

<5. Effect>

When a high-speed signal flows through the wiring 60, a skin effect in which a current concentratedly flows near the surface of the wiring 60 may increase. In the embodiment, at least some of the current flowing near the surface of the wiring 60 due to the skin effect can flow through the surface layer 62 of the wiring 60 formed of the second conductive material M2 having a lower electrical resistivity than that of the first conductive material M1.

FIG. 7 is a view showing an example of a skin depth of the printed wiring board 5. FIG. 7 shows, for example, a skin depth for a PCIe fifth generation (16 GHz) or sixth generation (32 GHz) signal. The skin depth d [μm] in FIG. 7 is obtained by the following Equation 1 wherein an electrical resistivity is ρ [Ω·m], an angular frequency (2πf) is co [Hz], and a magnetic permeability is μ [H/m]. [Equation 1]

$$d = \sqrt{\frac{2\rho}{\omega\mu}} \quad (1)$$

As shown in FIG. 7, in a case where silver is used as the wiring material, it can be seen that the skin depth d for a signal of 16 GHz is about 0.5 μm, and the skin depth d for a signal of 32 GHz is about 0.35 μm. That is, in a case where the surface layer 62 having a thickness of about 0.5 μm or about 0.35 μm is provided, most of the current concentrated near the surface of the wiring 60 due to the skin effect can flow through the surface layer 62.

<6. Advantages>

When a signal speed is further increased, an influence of the skin effect may become even greater. Therefore, in the embodiment, the wiring 60 of the printed wiring board 5 includes the main body 61 containing the first conductive material M1 and the surface layer 62 containing the second conductive material M2 having a smaller electrical resistivity than that of the first conductive material M1. The main body 61 is located between the second insulating base 20 and the solder resist layer 30. The surface layer 62 includes the first portion 62a located between the second insulating base 20 and the main body 61. With such a configuration, at least some of the current flowing near the surface of the wiring 60 due to the skin effect can flow through the surface layer 62 formed of the second conductive material M2 having the small electrical resistivity. Thus, the transmission characteristics can be improved. For example, a transmission speed can be increased and/or transmission loss can be reduced.

Here, it is also conceivable that the entire wiring is formed of the second conductive material M2 having the small electrical resistivity. However, the second conductive material M2 (for example, silver) having the relatively small electrical resistivity is often more expensive than the first conductive material M1 (for example, copper) having a relatively large electrical resistivity. Therefore, if the entire wiring is formed of the second conductive material M2, the manufacturing cost of the printed wiring board becomes high. On the other hand, in the embodiment, the main body 61 of the wiring 60 is formed of the first conductive material M1, and the surface layer 62 of the wiring 60 on which the current is concentrated due to the skin effect is formed of the second conductive material M2. With such a configuration, it is possible to improve the transmission characteristics of the printed wiring board 5 while an increase in the manufacturing cost of the printed wiring board 5 is curbed.

In the embodiment, the thickness T4a of the first portion 62a of the surface layer 62 of the wiring 60 in the Z direction is thinner than the thickness T3 of the main body 61 of the wiring 60 in the Z direction. With such a configuration, an amount of the second conductive material M2 used can be reduced, and the increase in the manufacturing cost of the printed wiring board 5 can be further curbed. Further, in the embodiment, a sum of the thickness T4a of the first portion 62a of the surface layer 62 in the Z direction and the thickness T4b of the second portion 62b of the surface layer 62 in the Z direction is thinner than the thickness T3 of the main body 61 of the wiring 60 in the Z direction. With such a configuration, the amount of the second conductive material M2 used can be further reduced.

In the embodiment, a high-speed signal having a frequency of 15 GHz or higher flows through the wiring 60. Each of the thicknesses T2a, T2b, T2c, and T2d of the surface layer 62 of the wiring 60 is, for example, 0.5 μm or less. With such a configuration, most of the current flowing through the wiring 60 can flow through the surface layer 62 of the wiring 60. Thus, the transmission characteristics can be further improved. Further, when each of the thicknesses T2a, T2b, T2c, and T2d of the surface layer 62 of the wiring 60 is about 0.5 μm, the manufacturing can be relatively easily performed even by electroless plating.

In the embodiment, the surface layer 62 of the wiring 60 includes the second portion 62h located between the solder resist layer 30 and the main body 61 of the wiring 60. With such a configuration, more current can flow through the surface layer 62. Thus, the transmission characteristics can be further improved.

In the embodiment, the ground layer 40 which serves as a reference and through which a return current flows also includes the main body 41 formed of the first conductive material M1 and the surface layer 42 formed of the second conductive material M2 having the relatively small electrical resistivity. With such a configuration, the return current also easily flows, and the transmission characteristics of the printed wiring board 5 can be further improved.

Here, the second conductive material M2 (for example, silver) may be more susceptible to ion migration (a phenomenon in which a conductive material is ionized and enters the insulating material) and/or corrosion as compared with the first conductive material M1 (for example, copper). However, in the embodiment, a part of the organic coating 70 is provided between the surface layer 62 of the wiring 60 and the second insulating base 20. Therefore, even when the surface layer 62 of the wiring 60 is formed of the second conductive material M2, the ion migration and/or the corrosion caused by the characteristics of the second conductive material M2 can be curbed. Thus, long-term reliability of the printed wiring board 5 can be improved.

In a case where the surface of the pad 80 is formed of the second conductive material M2 (for example, silver), bondability between the connection terminal S of the electronic component EC and the pad 80 can be improved when compared with a case in which the surface of the pad 80 is formed of the first conductive material M1 (for example, copper). Therefore, in a case where the surface of the pad 80 is formed of the second conductive material M2 (for example, silver), the flux F may be omitted or a roughening treatment of the surface of the pad 80 may be omitted. Thus, the manufacturing cost of the printed wiring board 5 can be reduced.

Modification Example

Next, a modification example of the first embodiment will be described. This modification example may be implemented in combination with any one of second to fourth embodiments which will be described later.

Figure 8:
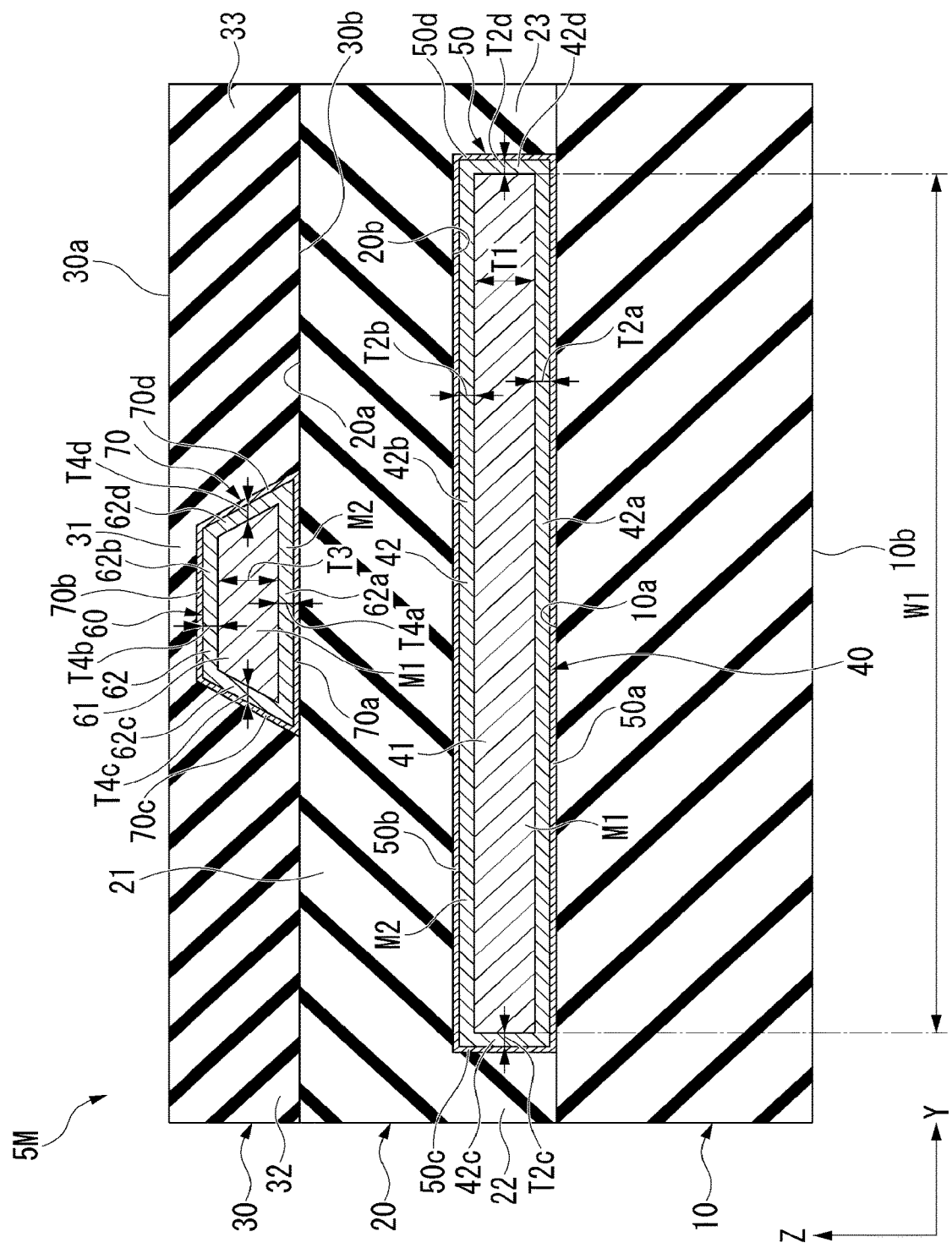
FIG. 8 is a cross-sectional view showing a printed wiring board according to a modification example of the first embodiment.

FIG. 8 is a cross-sectional view showing a printed wiring board 5M of a modification example of the first embodiment.

The printed wiring board 5M does not have the gaps Sa and Sb of the organic coating 50 and the gaps Sc and Sd of the organic coating 70 described above. That is, the first portion 50a of the organic coating 50 is connected to each of the third portion 50c and the fourth portion 50d of the organic coating 50. Similarly, the first portion 70a of the organic coating 70 is connected to each of the third portion 70c and the fourth portion 70d of the organic coating 70.

Figure 9:
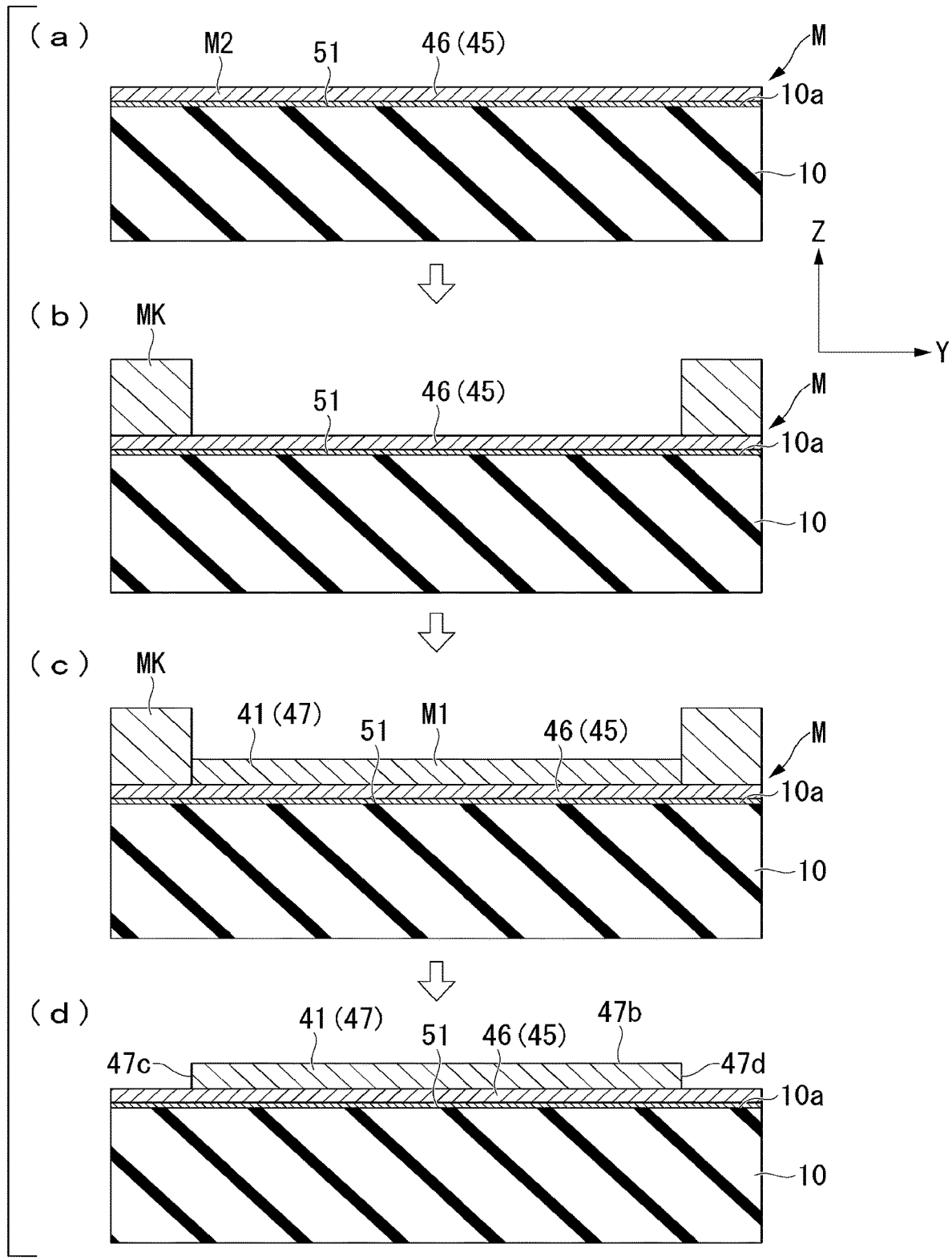
FIG. 9 is a cross-sectional view showing an example of a method for manufacturing the printed wiring board according to the modification example of the first embodiment.
Figure 10:
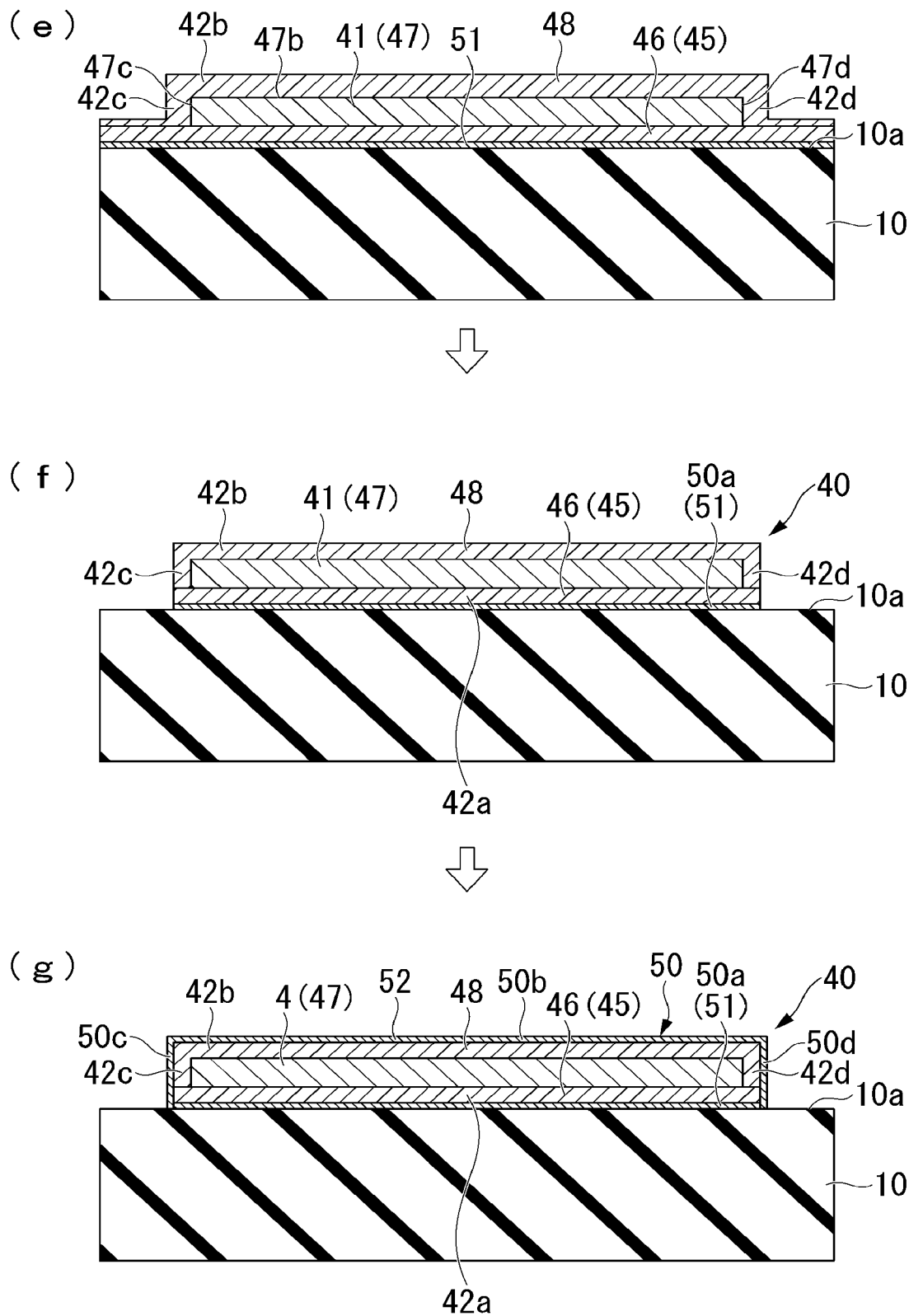
FIG. 10 is a cross-sectional view showing the example of the method for manufacturing the printed wiring board according to the modification example of the first embodiment.

FIGS. 9 and 10 are views showing a method for manufacturing the printed wiring board 5M according to the modification example. The manufacturing method according to the modification example is different from the above-described manufacturing method according to the first embodiment in that a semi-additive method such as flash etching or quick etching is used with the metal foil 45 (for example, a silver foil) containing the second conductive material M2 as a seed layer.

In the manufacturing method according to the modification example, as shown in (a) in FIG. 9, an intermediate structure M in which the second conductive layer 46 is provided on the first insulating base 10 is formed. The intermediate structure M can be manufactured in the same processes as those in the printed wiring board 5 of the first embodiment described with reference to (a) and (b) in FIG. 5. Similar to the first embodiment, the intermediate structure M includes the organic coating portion 51 interposed between the first insulating base 10 and the second conductive layer 46.

Next, as shown in (b) in FIG. 9, a mask MK is provided on the second conductive layer 46. The mask MK is provided on regions of the surface of the second conductive layer 46 where the main body 41 of the ground layer 40 is not to be formed.

Next, as shown in (c) in FIG. 9, the first conductive layer 47 containing the first conductive material M1 is formed on regions where the mask MK is not provided. The first conductive layer 47 of the modification example is a conductive layer which becomes the main body 41 of the ground layer 40 without performing the pattern processing. The first conductive layer 47 (that is, the main body 41 of the ground layer 40) is formed by performing a first plating treatment using the first conductive material M1. The first plating treatment may be electrolytic plating or electroless plating. In the case of the electrolytic plating, the relatively thick main body 41 can be preferably formed.

Next, as shown in (d) in FIG. 9, the mask MK is removed. As a result, the first surface 47b, the second surface 47c, and the third surface 47d of the first conductive layer 47 are exposed to the outside. The first surface 47b is a surface which is directed to a side opposite to the second conductive layer 46 in the Z direction. The second surface 47c is a surface which is directed in a direction different from that of the first surface 47b. The third surface 47d is a surface which is directed to a side opposite to the second surface 47c in the Y direction.

Next, as shown in (e) in FIG. 10, the third conductive layer 48 containing the second conductive material M2 is formed on the surface of the first conductive layer 47 (that is, the main body 41 of the ground layer 40) and on the surface of the region of the second conductive layer 46 which is not covered by the first conductive layer 47. The third conductive layer 48 is formed by performing a second plating treatment using the second conductive material M2. The second plating treatment is, for example, electroless plating. The third conductive layer 48 is formed to be in contact with the first surface 47b, the second surface 47c, and the third surface 47d of the first conductive layer 47, and the surface of the region of the second conductive layer 46 which is not covered by the first conductive layer 47. In this process, a thickness of the third conductive layer 48 is larger than the thickness of the surface layer 42 of the ground layer 40 of a finished product (i.e., finished printed wiring board 5M).

Next, as shown in (f) in FIG. 10, an unnecessary portion of the second conductive layer 46, an unnecessary portion of the third conductive layer 48, and an unnecessary portion of the organic coating portion 51 are removed by a semi-additive method such as flash etching or quick etching. Specifically, a portion of the second conductive layer 46 which is not covered by the first conductive layer 47 or the third conductive layer 48 (the unnecessary portion of the second conductive layer 46), a portion of the third conductive layer 48 provided on a surface of the unnecessary portion of the second conductive layer 46 (the unnecessary portion of the third conductive layer 48), and a portion of the organic coating portion 51 located between the unnecessary portion of the second conductive layer 46 and the first insulating base 10 (the unnecessary portion of the organic coating portion 51) are removed. In this process, a thickness of portions of the third conductive layer 48 provided on the surfaces of the first surface 47b, the second surface 47c, and the third surface 47d of the first conductive layer 47 becomes thin. When this etching process is completed, the surface layer 42 which surrounds the main body 41 of the ground layer 40 in an annular shape is formed by the third conductive layer 48 and the second conductive layer 46. Thus, the ground layer 40 is formed, and the first portion 50a of the organic coating 50 is formed. The term "flash etching (or the quick etching)" as used in explaining the embodiment means that when the semi-additive method is used, a thin metal seed layer provided for pattern plating is wholly removed by etching.

Next, as shown in (g) in FIG. 10, the material of the organic coating 50 is applied to the upper surface (the first surface 47b of the first conductive layer 47) and the left and right side surfaces (the second surface 47c and the third surface 47d of the first conductive layer 47) of the ground layer 40. Thus, the organic coating portion 52 which surrounds the ground layer 40 in three directions is formed. The organic coating portion 52 includes the second portion 50b, the third portion 50c, and the fourth portion 50d of the organic coating 50 described above. When the organic coating portion 52 is formed, the organic coating 50 which surrounds the surface layer 42 in an annular shape from the outer peripheral side is formed by the organic coating portion 52 and the above-described organic coating portion 51. As described above, in the modification example, the first portion 50a of the organic coating 50 is connected to each of the third portion 50c and the fourth portion 50d of the organic coating 50.

After that, the second insulating base 20 is stacked on the first insulating base 10 and the ground layer 40, as in the printed wiring board 5 of the first embodiment. Further, the wiring 60 and the organic coating 70 are manufactured by the same method as the manufacturing method of the ground layer 40 and the organic coating 50 of the modification example. Finally, the solder resist layer 30 is provided.

Second Embodiment

Next, a second embodiment will be described. The second embodiment is different from the first embodiment in that each of the ground layer 40 and the wiring 60 includes a double organic coating layer. Configurations other than that described below are the same as the configurations of the first embodiment.

Figure 11:
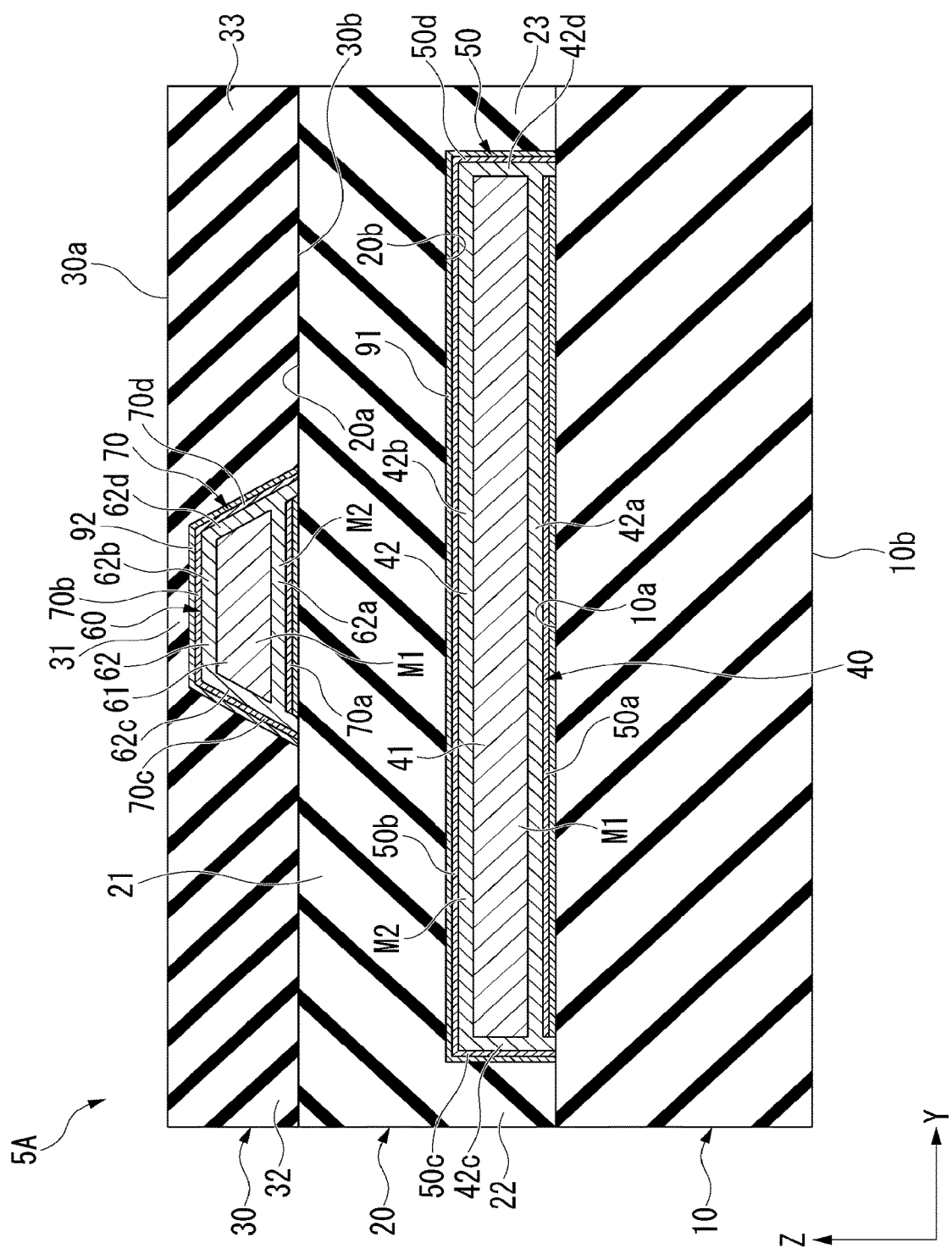
FIG. 11 is a cross-sectional view showing a printed wiring board according to a second embodiment.

FIG. 11 is a cross-sectional view showing a printed wiring board 5A of the second embodiment. In the embodiment, the printed wiring board 5A includes an organic coating 91 and an organic coating 92 in addition to the configurations of the printed wiring board 5 of the first embodiment.

The organic coating 91 is formed in an annular shape which covers the organic coating 50 from the outer peripheral side. The organic coating 91 is provided between the organic coating 50 and the first insulating base 10, and between the organic coating 50 and the second insulating base 20.

Similarly, the organic coating 92 is formed in an annular shape which covers the organic coating 70 from the outer peripheral side. The organic coating 92 is provided between the organic coating 70 and the second insulating base 20, and between the organic coating 70 and the solder resist layer 30.

In the embodiment, the organic coatings 50 and 70 are functional layers which curb ion migration of the second conductive material M2 as described above. The organic coatings 50 and 70 are formed by applying, for example, a chelating agent or a thiol agent. Each of the organic coatings 50 and 70 is an example of a "first organic coating".

On the other hand, the organic coatings 91 and 92 are functional layers which enhance adhesiveness (in other words, bondability) between the organic coatings 50 and 70 and the insulating bases 10 and 20 or the solder resist layer 30. The organic coatings 91 and 92 are formed of a material different from that of the organic coatings 50 and 70. The organic coatings 91 and 92 are formed of a material which is easier to adhere to the insulating bases 10 and 20 or the solder resist layer 30 than to the organic coatings 50 and 70. The organic coatings 91 and 92 are formed of, for example, a silane coupling agent. Each of the organic coatings 91 and 92 is an example of a "second organic coating".

With such a configuration, even when the organic coatings 50 and 70 are provided to curb the ion migration, the corrosion or the like, the adhesiveness between the ground layer 40 or the wiring 60 and the insulating bases 10 and 20 or the solder resist layer 30 can be enhanced. Thus, the long-term reliability of the printed wiring board 5A can be further improved.

Third Embodiment

Next, a third embodiment will be described. The third embodiment is different from the first embodiment in that it has a via 95 which connects the ground layer 40 to the wiring 60. The configurations other than that described below is the same as the configurations of the first embodiment.

Figure 12:
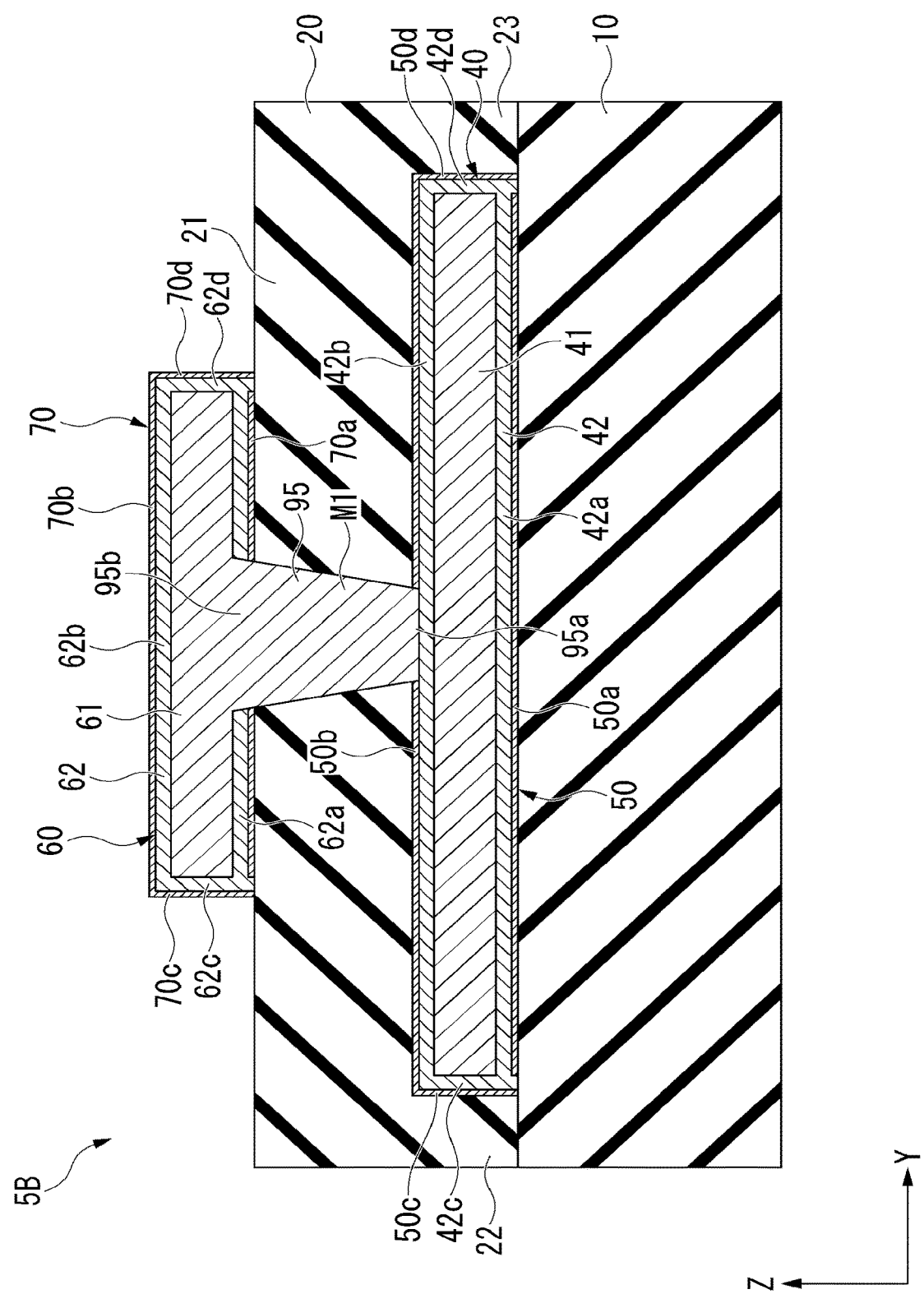
FIG. 12 is a cross-sectional view showing a printed wiring board according to a third embodiment.

FIG. 12 is a cross-sectional view showing a printed wiring board 5B according to the third embodiment. FIG. 12 shows a portion of the printed wiring board 5B. In the embodiment, the printed wiring board 5B includes the via 95 in addition to the configurations of the printed wiring board 5 of the first embodiment. In the example shown in FIG. 12, the printed wiring board 5B includes the ground layer 40, the wiring 60, and the via 95 which connects the ground layer 40 and the wiring 60. Note that the via 95 is not limited to a via which connects the ground layer 40 and the wiring 60, and may be a via which connects a plurality of wirings 60. In this case, the "ground layer 40," the "main body 41," and the "surface layer 42" in the following description are replaced with the "wiring 60," the "main body 61," and the "surface layer 62", respectively. The via 95 is an example of a "conductive connector". Note that the "conductive connector" may be a through hole or the like.

The via 95 is interposed between the ground layer 40 and the wiring 60 in the Z direction. That is, the via 95 overlaps the ground layer 40 in the Z direction and overlaps the wiring 60 in the Z direction. The via 95 is provided inside the second insulating base 20 and extends in the Z direction inside the second insulating base 20. The via 95 is formed of, for example, the first conductive material M1.

The via 95 includes, as end portions in the Z direction, a first end portion 95a and a second end portion 95b located on a side opposite to the first end portion 95a. The first end portion 95a of the via 95 is in contact with the second portion 42b of the surface layer 42 of the ground layer 40. The second end portion 95b of the via 95 is in contact with the main body 61 and the surface layer 62 of the wiring 60. Thus, the via 95 electrically connects the ground layer 40 and the wiring 60.

With such a configuration, since the via 95 and the surface layer 42 of the ground layer 40 are connected, a current flowing through the surface layer 62 of the wiring 60 can be efficiently guided to the surface layer 42 of the ground layer 40. Thus, the transmission loss can be further reduced, and the transmission characteristics can be improved.

Fourth Embodiment

Next, a fourth embodiment will be described. The fourth embodiment is different from the third embodiment in that the via 95 includes a surface layer formed of the second conductive material M2. The configurations other than that described below is the same as the configurations of the third embodiment.

Figure 13:
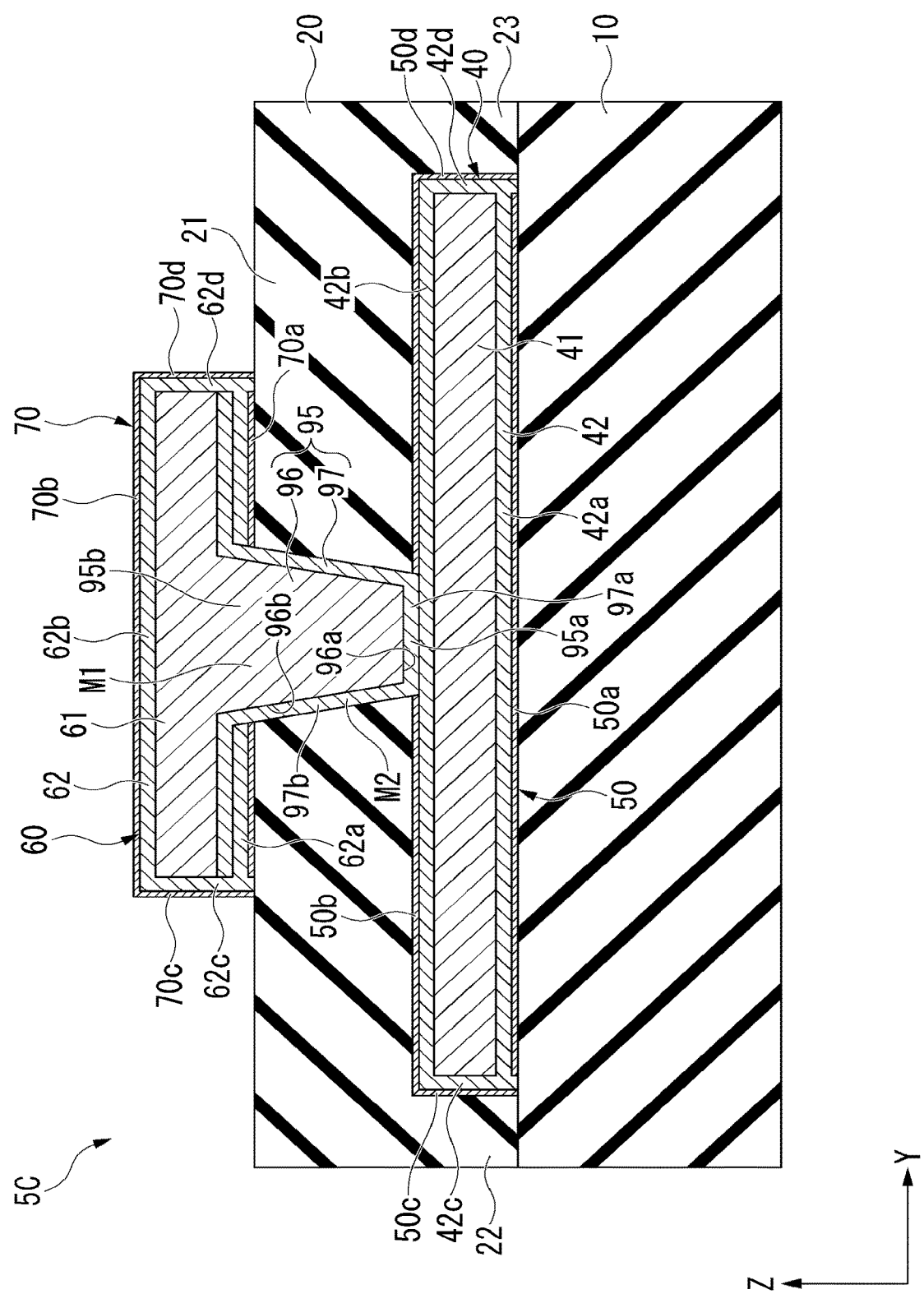
FIG. 13 is a cross-sectional view showing a printed wiring board according to a fourth embodiment.

FIG. 13 is a cross-sectional view showing a printed wiring board 5C according to the fourth embodiment. In the embodiment, the via 95 includes a main body 96 and a surface layer 97. The main body 96 is located between the second portion 42b of the surface layer 42 of the ground layer 40 and the main body 61 of the wiring 60 in the Z direction. The main body 96 extends in the Z direction inside the second insulating base 20. In the embodiment, the main body 96 is in contact with the main body 61 of the wiring 60. For example, the main body 96 has a bottom surface 96a which faces the ground layer 40 and a peripheral surface 96b which extends from a peripheral edge portion of the bottom surface 96a toward the wiring 60. The main body 96 is formed of the first conductive material M1. The main body 96 is an example of the "third conductor".

The surface layer 97 is formed of the second conductive material M2. The surface layer 97 is an example of a "fourth conductor". The surface layer 97 includes a first portion 97a and a second portion 97b.

The first portion 97a is located between the surface layer 42 of the ground layer 40 and the main body 96 of the via 95 in the Z direction. The first portion 97a extends along the bottom surface 96a of the main body 96 of the via 95 in the X direction and the Y direction. The first portion 97a is in contact with the surface layer 42 of the ground layer 40 in the Z direction and is in contact with the main body 96 of the via 95 in the Z direction.

The second portion 97b extends from the peripheral edge portion of the first portion 97a toward the surface layer 62 of the wiring 60. The second portion 97b extends along the peripheral surface 96b of the main body 96 of the via 95. The second portion 97b is located between the second insulating base 20 and the main body 96 of the via 95 in the X direction and the Y direction. The second portion 97b is formed in an annular shape which surrounds the main body 96 in the X direction and the Y direction. The second portion 97b is in contact with the first portion 62a of the surface layer 62 of the wiring 60. That is, the first portion 97a and the second portion 97b form a current path having a small electrical resistivity which connects the surface layer 42 of the ground layer 40 and the surface layer 62 of the wiring 60.

Next, a method for manufacturing the printed wiring board 5C according to the fourth embodiment will be described.

Figure 14:
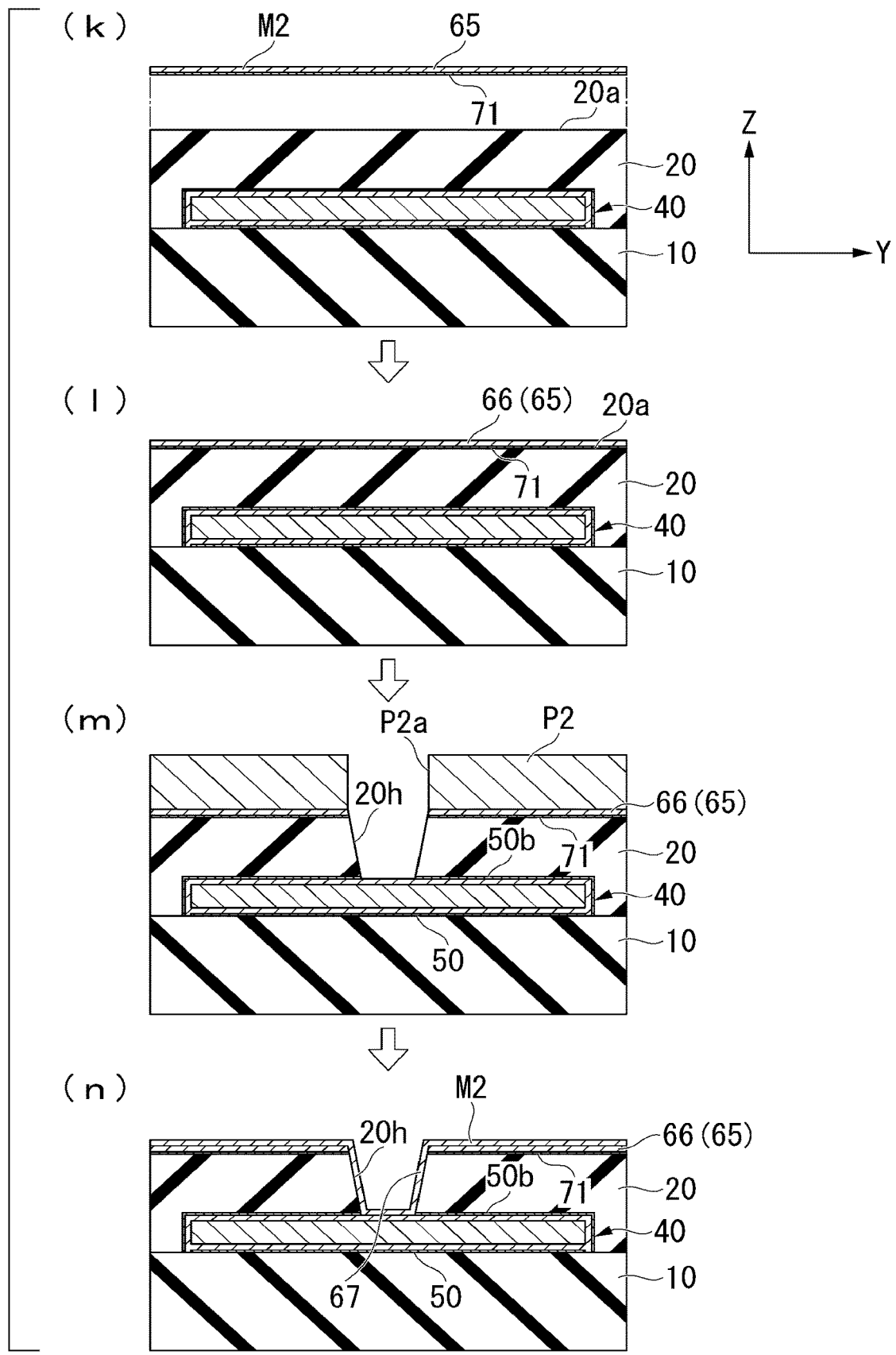
FIG. 14 is a cross-sectional view showing an example of a method for manufacturing the printed wiring board according to the fourth embodiment.
Figure 15:
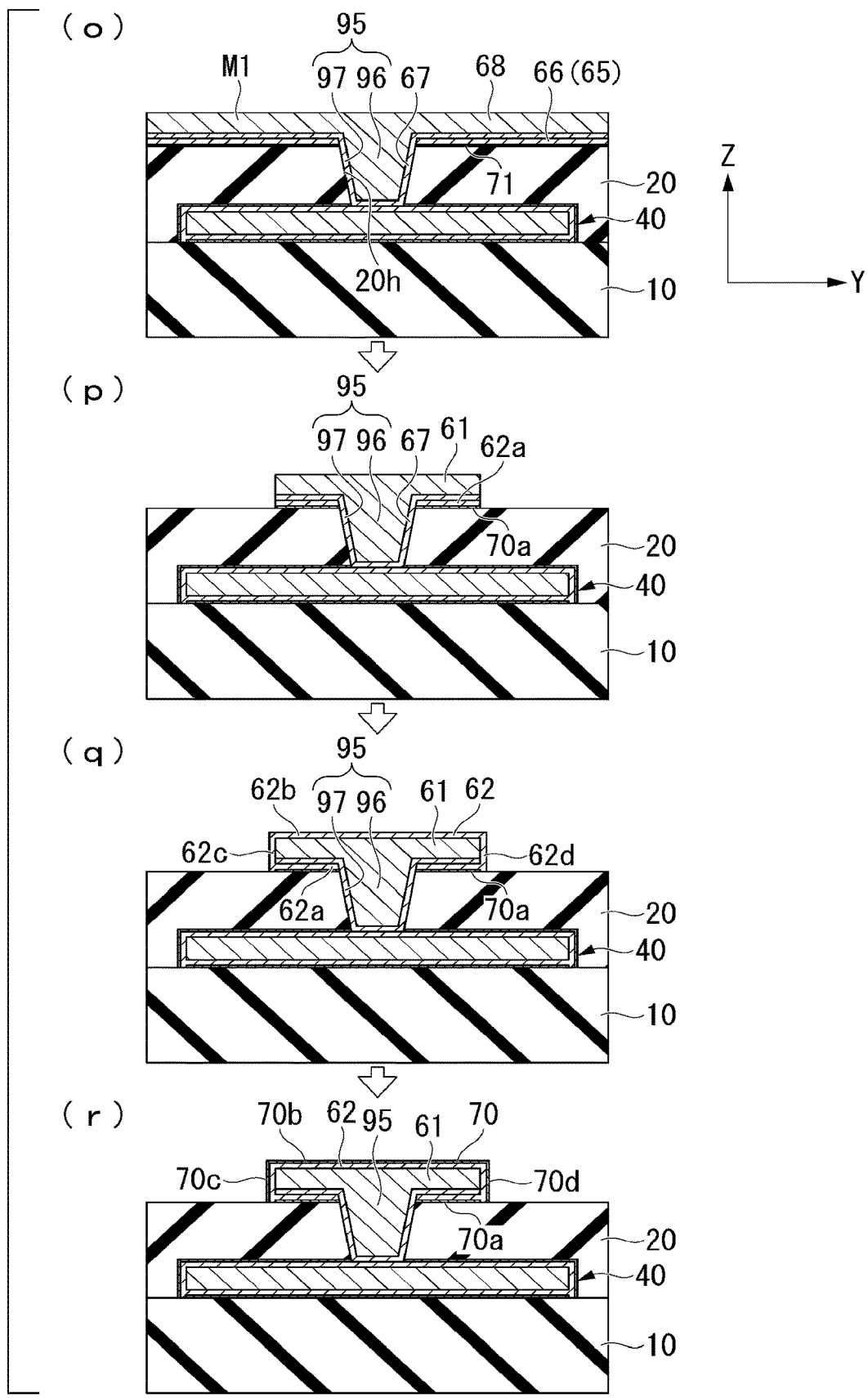
FIG. 15 is a cross-sectional view showing the example of the method for manufacturing the printed wiring board according to the fourth embodiment.

FIGS. 14 and 15 are views showing an example of the method for manufacturing the printed wiring board 5C. First, an intermediate structure shown in (g) in FIG. 6 is formed by the same processes as those of the printed wiring board 5 of the first embodiment described with reference to FIGS. 5 and 6. Then, as shown in (k) in FIG. 14, the metal foil 65 (for example, a silver foil) containing the second conductive material M2 is prepared. The material of the organic coating 70 is applied to one surface (the lower surface in FIG. 14) of the metal foil 65 to form a layered organic coating portion 71. The organic coating portion 71 is provided on, for example, the entire surface of one surface of the metal foil 65.

Next, as shown in (l) in FIG. 14, the metal foil 65 with the organic coating portion 71 provided on one surface thereof is attached to the first surface 20a of the second insulating base 20 of the intermediate structure. The metal foil 65 is attached to the second insulating base 20 by, for example, pressure welding, but other methods may be used. Thus, a conductive layer 66 is formed on the second insulating base 20. The conductive layer 66 is a planar layer which extends in the X direction and the Y direction.

Next, as shown in (m) in FIG. 14, a protective film (a resist) P2 is formed on the conductive layer 66. Then, through an opening P2a formed in the protective film P2, a hole 20h which passes through the conductive layer 66, the organic coating portion 71, and the second insulating base 20 in the Z direction is provided. For example, in the process to form the hole 20h, a part of the second portion 50b of the organic coating 50 located in a region corresponding to the hole 20h is removed. As a result, the via 95 comes into contact with the surface layer 42 of the ground layer 40 without via the organic coating 50 in a subsequent process. When the via 95 is connected to the wiring 60 in place of/in addition to the ground layer 40, the via 95 comes into contact with the surface layer 62 of the wiring 60 without via the organic coating 70.

Next, the protective film P2 is removed, and as shown in (n) in FIG. 14, a plating process using the second conductive material M2 is performed on an inner surface of the hole 20h and a surface of the conductive layer 66. Thus, a conductive layer 67 containing the second conductive material M2 along the inner surface of the hole 20h is formed. Before the conductive layer 67 is provided, a process may be added to provide an organic coating similar to the organic coating 50 (or the organic coating 70) on the inner surface of the hole 20h. The conductive layer 67 forms the surface layer 97 of the via 95 and also forms a part of the first portion 62a of the surface layer 62 of the wiring 60.

Next, as shown in (o) in FIG. 15, a plating process using the first conductive material M1 is performed on the conductive layer 66. Thus, the main body 96 of the via 95 is formed by filling the inside of the hole 20h, and a conductive layer 68 including the first conductive material M1 spreading on the conductive layer 66 is formed. The main body 96 formed in this process is combined with the surface layer 97 formed earlier, and thus the via 95 is formed.

Next, as shown in (p) in FIG. 15, the pattern processing is performed on the conductive layer 66, the organic coating portion 71, and the conductive layer 68. Thus, the first portion 62a of the surface layer 62 of the wiring 60 is formed of the conductive layer 66, the main body 61 of the wiring 60 is formed of the conductive layer 68, and the first portion 70a of the organic coating 70 is formed of the organic coating portion 71. Then, as shown in (q) and (r) in FIG. 15, the same processes as in (e) and (f) in FIG. 5 are performed, and thus the surface layer 62 of the wiring 60 and the organic coating 70 are formed.

With such a configuration, at least some of the current flowing from the wiring 60 to the ground layer 40 can flow through the surface layer 97 of the via 95 formed of the second conductive material M2 having a low electrical resistivity. Thus, the transmission characteristics of the printed wiring board 5 can be further improved.

Although some embodiments and modification examples have been described above, the embodiments are not limited to the above-described examples. Some of the embodiments and modification examples described above can be realized in combination with each other.

According to at least one embodiment described above, the printed wiring board includes a first insulator, a second insulator, a first conductor, and a second conductor. The first conductor is located between the first insulator and the second insulator, and contains a first conductive material. The second conductor includes a first portion located between the first insulator and the first conductor, and contains a second conductive material having a smaller electrical resistivity than that of the first conductive material. With such a configuration, the transmission characteristics can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A printed wiring board comprising:
a first insulator;
a second insulator;
a first conductor between the first insulator and the second insulator,
the first conductor containing a first conductive material; and
a second conductor including a first portion,
the first portion being between the first insulator and the first conductor,
the first portion being in contact with the first conductor and extending along the first conductor,
the second conductor containing a second conductive material,
the second conductive material being lower in electrical resistivity than the first conductive material,
wherein the second insulator is closer to an outside of the printed wiring board than the first insulator is in a thickness direction of the printed wiring board; and
further comprising:
a first organic coating, at least a part of the first organic coating being between the second conductor and the first insulator;
a second organic coating, at least a part of the second organic coating being between the first organic coating and the first insulator,
the second organic coating including a material different from a material of the first organic coating;
a conductive connector extending inside the second insulator in the thickness direction of the printed wiring board;
wherein the second conductor includes a second portion,
the second portion being between the first conductor and the conductive connector and being in contact with the conductive connector,
the conductive connector includes a third conductor and a fourth conductor,
the third conductor containing the first conductive material, the fourth conductor being between the third conductor and the second conductor and containing the second conductive material, and a part of the second conductor is in contact with the fourth conductor.

2. The printed wiring board according to claim 1, further comprising
a pad exposed to the outside of the printed wiring board,
wherein the first conductor and the second conductor are connected to the pad.

3. The printed wiring board according to claim 1, wherein
a thickness of the first portion of the second conductor in the thickness direction of the printed wiring board is smaller than a thickness of the first conductor in the thickness direction of the printed wiring board.

4. The printed wiring board according to claim 1, wherein
the second conductor further includes a second portion,
the second potion being between the second insulator and the first conductor,
the second potion being in contact with the first conductor and extending along the first conductor.

5. The printed wiring board according to claim 4, wherein
the second conductor further includes a third portion,
the third portion being in contact with the first conductor in a direction different from directions in which the first portion and the second portion are in contact with the first conductor, respectively,
the third portion extending along the first conductor.

6. The printed wiring board according to claim 5, wherein
the third portion extends in the thickness direction of the printed wiring board and connects the first portion and the second portion.

7. The printed wiring board according to claim 1, wherein
the second conductor is in an annular shape surrounding the first conductor.

8. The printed wiring board according to claim 1, wherein
the first conductive material includes copper, and
the second conductive material includes silver.

9. A memory system comprising:
a printed wiring board;
a controller on the printed wiring board; and
a semiconductor memory device on the printed wiring board,
wherein
the printed wiring board includes a first insulator,
a second insulator,
a first conductor,
and a second conductor,
the second insulator being closer to an outside of the printed wiring board than the first insulator is in a thickness direction of the printed wiring board,
the first conductor being between the first insulator and the second insulator and containing a first conductive material,
the second conductor including a first portion,
the first portion being between the first insulator and the first conductor,
the first portion being in contact with the first conductor and extending along the first conductor,
the second conductor containing a second conductive material,
the second conductive material being lower in electrical resistivity than the first conductive material, and
a wiring connected to the controller is formed by the first conductor and the second conductor; and
further comprising:
a first organic coating,
at least a part of the first organic coating being between the second conductor and the first insulator;
a second organic coating, at least a part of the second organic coating being between the first organic coating and the first insulator,
the second organic coating including a material different from a material of the first organic coating;
a conductive connector extending inside the second insulator in the thickness direction of the printed wiring board;
wherein the second conductor includes a second portion,
the second portion being between the first conductor and the conductive connector and being in contact with the conductive connector,
the conductive connector includes a third conductor and a fourth conductor,
the third conductor containing the first conductive material,
the fourth conductor being between the third conductor and the second conductor and containing the second conductive material, and
a part of the second conductor is in contact with the fourth conductor.

10. The memory system according to claim 9, wherein a thickness of the first portion of the second conductor in the thickness direction of the printed wiring board is smaller than a thickness of the first conductor in the thickness direction of the printed wiring board.

11. The memory system according to claim 9, wherein the second conductor further includes a second portion,
the second potion being between the second insulator and the first conductor,
the second potion being in contact with the first conductor and extending along the first conductor, and
the second conductor further includes a third portion,
the third portion being in contact with the first conductor in a direction different from directions in which the first portion and the second portion are in contact with the first conductor, respectively,
the third portion extending along the first conductor.

* * * * *